(12) United States Patent
Wang et al.

(10) Patent No.: US 11,152,060 B2
(45) Date of Patent: Oct. 19, 2021

(54) MULTI-BIT READ-ONLY MEMORY DEVICE

(71) Applicant: Intel Corporation, Santa Clara, CA (US)

(72) Inventors: Xiaofei Wang, Hillsboro, OR (US); Dinesh Somasekhar, Portland, OR (US); Clifford Ong, Portland, OR (US); Eric A Karl, Portland, OR (US); Zheng Guo, Hillsboro, OR (US); Gordon Carskadon, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/449,285

(22) Filed: Jun. 21, 2019

(65) Prior Publication Data

US 2020/0402574 A1    Dec. 24, 2020

(51) Int. Cl.
*G11C 11/56*         (2006.01)
*G11C 17/12*         (2006.01)
*H01L 27/112*        (2006.01)

(52) U.S. Cl.
CPC ........ *G11C 11/5692* (2013.01); *G11C 17/123* (2013.01); *H01L 27/11253* (2013.01)

(58) Field of Classification Search
CPC ........ G11C 11/5692; G11C 11/56; G11C 8/10
USPC .................................................. 365/230.03
See application file for complete search history.

(56) References Cited

U.S. PATENT DOCUMENTS

| 5,598,365 A | 1/1997 | Shoji |
| 5,870,326 A | 2/1999 | Schuelein |
| 7,411,808 B2 | 8/2008 | Chang |
| 2005/0226068 A1 | 10/2005 | Brandon et al. |
| 2010/0118616 A1* | 5/2010 | Chung ................. G11C 7/1012 365/189.02 |
| 2013/0170273 A1 | 7/2013 | Rachamadugu et al. |
| 2014/0269057 A1* | 9/2014 | Shereshevski ...... G11C 11/5628 365/185.03 |

FOREIGN PATENT DOCUMENTS

WO    WO-2020257067 A1    12/2020

OTHER PUBLICATIONS

"International Application Serial No. PCT/US2020/037326, International Search Report dated Sep. 25, 2020", 3 pgs.
"International Application Serial No. PCT/US2020/037326, Written Opinion dated Sep. 25, 2020", 7 pgs.
Sung, Star, et al., "A nor-type MLC ROM with Novel Sensing Scheme for Embedded Applications", IEEE International Workshop on Memory Technology, Design and Testing, (2005), 22-25.

* cited by examiner

*Primary Examiner* — Anthan Tran
(74) *Attorney, Agent, or Firm* — Schwegman Lundberg & Woessner, P.A.

(57) ABSTRACT

Some embodiments include apparatuses having non-volatile memory cells, each of the non-volatile memory cells to store more than one bit of information; data lines, at most one of the data lines electrically coupled to each of the non-volatile memory cells; a circuit including transistors coupled to the data lines, the transistors including gates coupled to each other; and an encoder including input nodes and output nodes, the input nodes to receive input information from the data lines through the transistors, and the output nodes to provide output information having a value based on a value of the input information.

8 Claims, 12 Drawing Sheets

| LOGIC STATE | LBL2 | LBL1 | LBL0 | BL1 NAND<LBL2,LBL1> | BL0 NAND<LBL1,LBL0> |
|---|---|---|---|---|---|
| 1 (01) | 1 | 1 | 0 | 0 | 1 |
| 1 (11) | 1 | 0 | 1 | 1 | 1 |
| 1 (10) | 0 | 1 | 1 | 1 | 0 |
| 1 (00) | 1 | 1 | 1 | 0 | 0 |

FIG. 3

| LOGIC STATE | LBL3 | LBL2 | LBL1 | LBL0 | BL2 NAND<LBL3,LBL0> | BL1 XOR<LBL2,LBL0> | BL0 NAND<LBL3,LBL1> |
|---|---|---|---|---|---|---|---|
| 1 (000) | 1 | 1 | 1 | 1 | 0 | 0 | 0 |
| 2 (010) | 1 | 0 | 1 | 1 | 0 | 1 | 0 |
| 3 (101) | 0 | 1 | 1 | 1 | 1 | 0 | 1 |
| 4 (110) | 1 | 1 | 1 | 0 | 1 | 1 | 0 |
| 5 (100) | 1 | 0 | 1 | 0 | 1 | 0 | 0 |
| 6 (111) | 0 | 1 | 1 | 1 | 0 | 1 | 1 |
| 7 (001) | 1 | 1 | 0 | 1 | 0 | 0 | 1 |
| 8 (011) | 1 | 0 | 0 | 1 | 1 | 1 | 1 |
| 9 (UNUSED) | 0 | 1 | 0 | 1 | 1 | 0 | 1 |

| BL0 | BL1 | TRANSISTOR SOURCE | TRANSISTOR DRAIN |
|---|---|---|---|
| 1 | 1 | WIRE_3 | Vss |
| 1 | 1 | Vss | WIRE_3 |
| 1 | 1 | WIRE_1 | WIRE_2 |
| 1 | 1 | WIRE_2 | WIRE_1 |
| 1 | 0 | WIRE_1 | Vss |
| 1 | 0 | Vss | WIRE_1 |
| 1 | 0 | WIRE_2 | WIRE_3 |
| 1 | 0 | WIRE_3 | WIRE_2 |
| 0 | 1 | WIRE_2 | Vss |
| 0 | 1 | Vss | WIRE_2 |
| 0 | 1 | WIRE_1 | WIRE_3 |
| 0 | 1 | WIRE_3 | WIRE_1 |
| 0 | 0 | WIRE_1 | WIRE_1 |
| 0 | 0 | WIRE_2 | WIRE_2 |
| 0 | 0 | WIRE_3 | WIRE_3 |
| 0 | 0 | Vss | Vss |
| 0 | 0 | FLOAT | FLOAT |
| 0 | 0 | FLOAT | FLOAT |

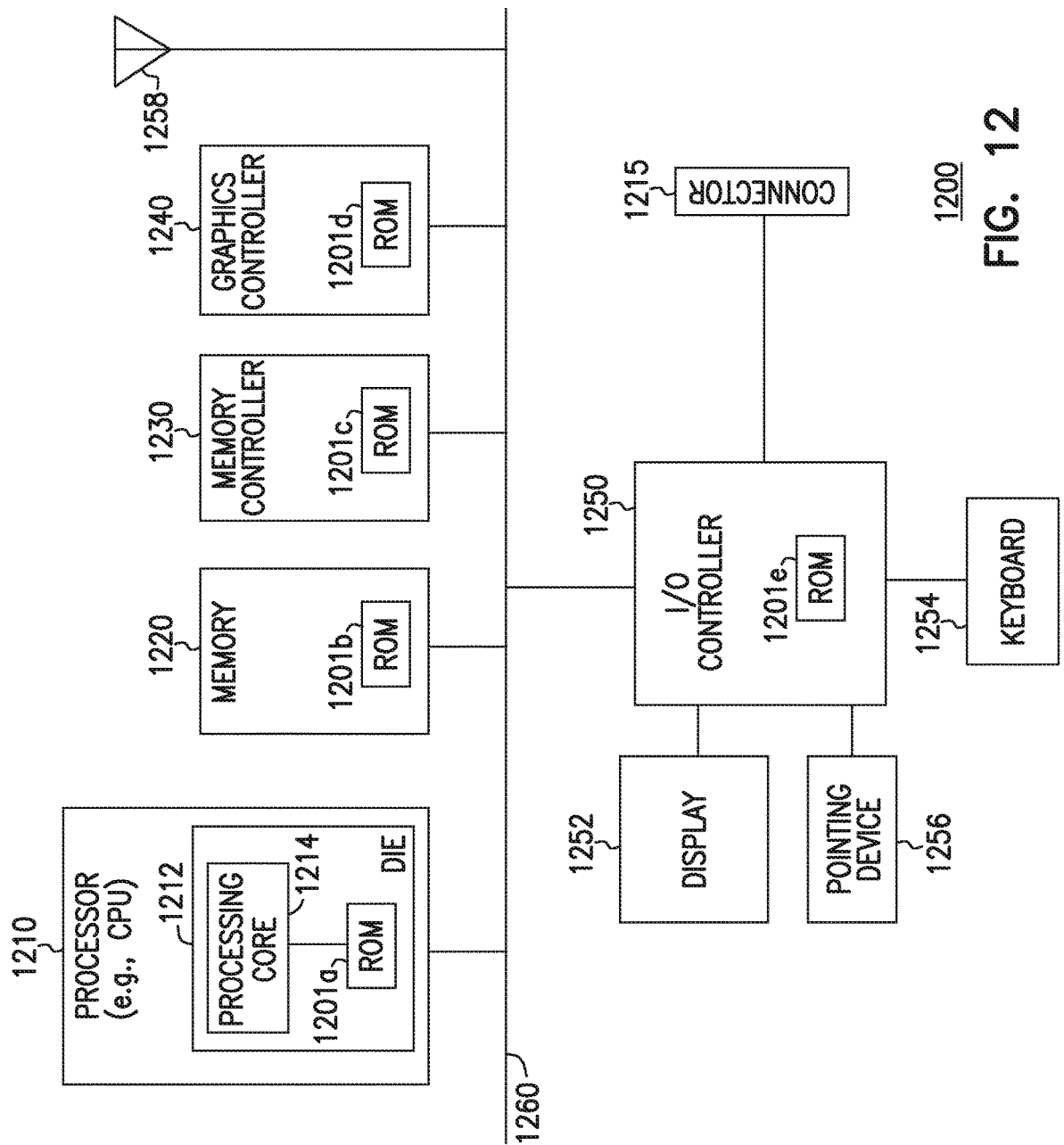

and row select signals) to access memory cells 102 and read information from (or write information to) memory cells 102.

MULTI-BIT READ-ONLY MEMORY DEVICE

TECHNICAL FIELD

Embodiments described herein pertain to memory devices in electronic systems. Some embodiments relate to read-only memory (ROM) devices.

BACKGROUND

Many electronic devices or systems, such as computers, tablets, and cellular phones, have memory to store information (e.g., data). Some conventional memory devices (e.g., ROM devices) may be used to store fixed information, such as micro-codes and other information. Many conventional techniques are designed to increase storage density of the memory device. However, some of such conventional techniques may be infeasible or involve complex sensing schemes.

BRIEF DESCRIPTION OF THE DRAWINGS

FIG. 3 is a chart showing logic states and corresponding binary values that can be stored in a memory cell of the memory device of FIG. 2, and encoding values corresponding to the logic states, according to some embodiments described herein.

FIG. 5 is a chart showing logic states and corresponding binary values that can be stored in a memory cell pair of the memory device of FIG. 4, and encoding values corresponding to the logic states, according to some embodiments described herein.

FIG. 10 is a chart showing values of two bits BL0 and BL1 that can be stored in a memory cell of the memory device of FIG. 9 and all possible connection combinations (e.g., different options) for forming a connection between each of the source and drain of the transistor of the memory cell and conductive lines of the memory device, according to some embodiments described herein.

FIG. 12 shows a block diagram of an apparatus in the form of a system (e.g., electronic system), according to some embodiments described herein.

DETAILED DESCRIPTION

The techniques described herein relate to increasing the storage density of a non-volatile memory device. An aspect of the described techniques includes storing more than one bit of information in a memory cell of the memory device. The described techniques can be applicable to ROM Fin Field-effect transistor (FinFET) or other type of ROM devices.

Some conventional techniques may store more than one bit in a memory cell of a memory device by using different threshold voltages for different values of information to be stored in the memory cell. However, such conventional techniques face many challenges. For example, additional tasks may be required to provide tuning of threshold voltage values that may be infeasible. Further, such conventional techniques often require complex sensing to scheme with multiple reference points to determine the stored value in the memory cell.

As described in more details below, the techniques described herein can store more than one bit of information in a memory cell of a ROM device and avoid challenges that some conventional techniques may face. Improvements and benefits of the described techniques include a relatively simple implementation and a reduction in device area for a given storage density. Other technical effects of the techniques described herein will be apparent from various examples and figures described below.

Figure 1:
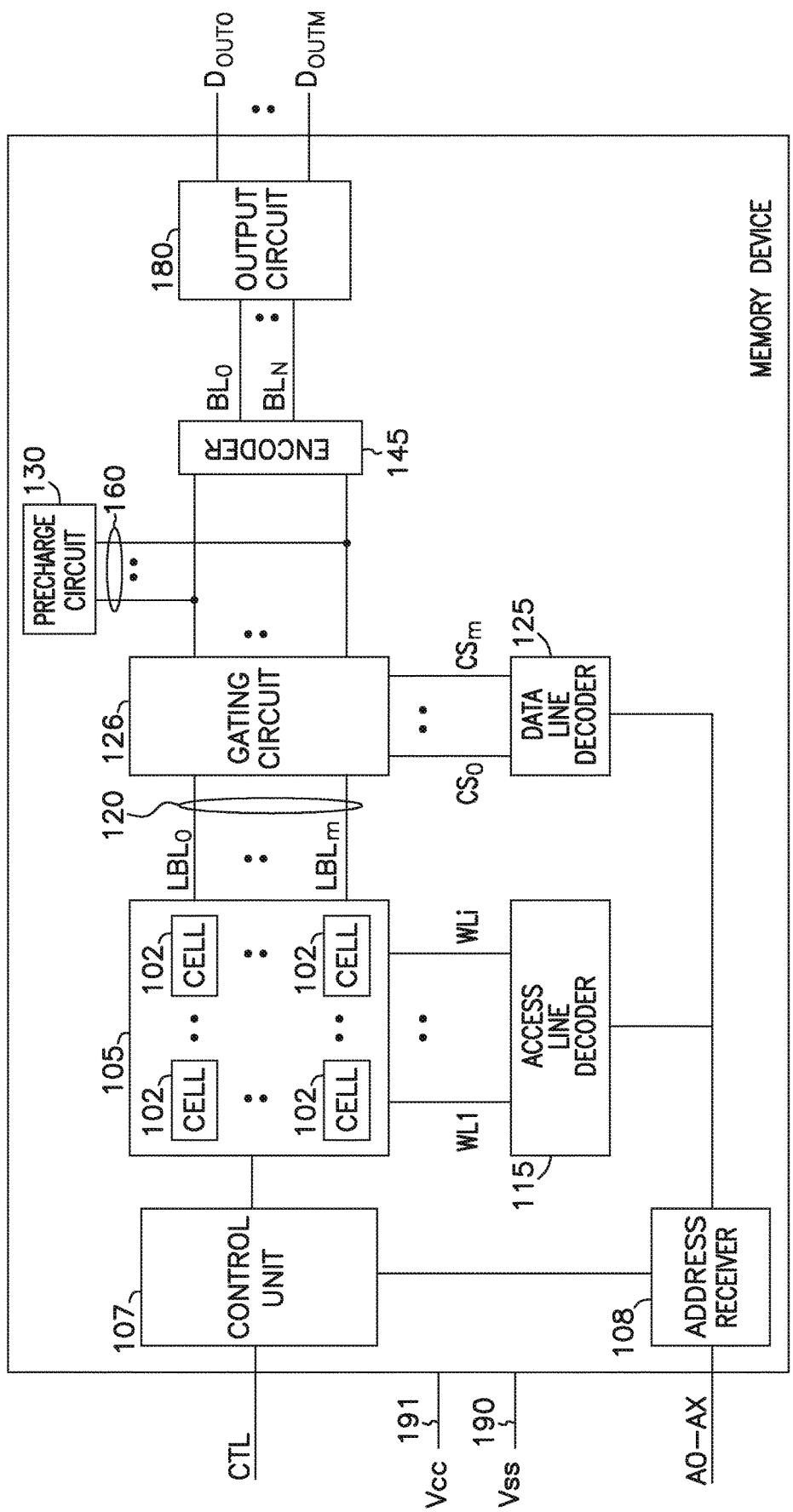
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a non-volatile memory device. For example, device 100 can include a ROM (e.g., mask ROM) device. As shown in FIG. 1, memory device 100 can include a memory array 105 having memory cells 102 that can be arranged in a matrix (e.g., rows and columns). Memory device 100 can include access lines (e.g., word lines) that can carry signals (e.g., word line signals) $WL_1$ through $WL_i$, and data lines (e.g., local bit lines) 120 that can carry signals that represent bits $LBL_0$ through $LBL_m$. Memory device 100 can include nodes (e.g., supply nodes) 191 and 190 to receive supply voltage Vcc and Vss. Supply voltage Vcc can include voltage having a positive value (e.g., 1.2V or other values). Supply voltage Vss can include zero volts (e.g., ground potential).

Memory device 100 can include a control unit 107, an address receiver (e.g., address buffer) 108, an access line (e.g., row line or word line) decoder 115, and a data line (e.g., column line or bit line) decoder 125, a gating circuit 126 coupled to a precharge circuit 130 and an encoder 145 through conductive lines 160, and an output circuit 180. Control unit 107 can control operations (e.g., read operations) of memory device 100 based on control information (e.g., control signals) CTL. Address receiver 108 can receive address information (e.g., address signals) A0-AX during an operation (e.g., a read operation) of reading (e.g., retrieving) information from memory cells 102.

During a read operation to read information from selected memory cells among memory cells 102, access line decoder 115 and data line decoder 125 can decode address information A0-Ax and generate signals (e.g., column select signals)

$CS_0$ through $CS_m$ to selectively access the selected memory cells through the access lines (associated with signals $WL_1$ through $WL_i$) and data lines 120 (associated with bits $LBL_0$ through $LBL_m$). Precharge circuit 130 can charge (e.g., precharge) data lines (e.g., local bit lines) 120 and conductive lines 160 to a precharge voltage level (e.g., Vcc) during a stage (e.g., a precharge stage) of the read operation. Selected data lines (e.g., selected local bit lines) among data lines 120 can be electrically coupled to encoder 145 near the end of the precharge stage, so that the selected data lines can be precharged before an evaluation stage (e.g., a stage that occurs after the precharge stage) of the read operation. Gating circuit 126 can selectively form circuit paths between data lines 120 and encoder 145 during the evaluation stage. Encoder 145 can generate bits $BL_0$ through $BL_N$ based on bits $LBL_0$ through $LBL_m$. Output circuit 180 can receive bits $BL_0$ through $BL_N$ from encoder 145 and generate information (e.g., output data bits) $D_{OUT0}$ through $D_{OUTN}$ based on receive bits $BL_0$ through $BL_N$. The values of bits $LBL_0$ through $LBL_m$ can be based on the values of information (e.g., previously stored information) read from a selected memory cell (or memory cells) of memory array 105. Thus, the values of information $D_{OUT0}$ through $D_{OUTN}$ can represent the values of information read from a selected memory cell (or memory cells) of memory array 105.

Memory cells 102 can include non-volatile memory cells, such that information stored in memory cells 102 can be retained (e.g., information is not lost) if the supply power (e.g., voltage Vcc) is disconnected from memory device 100.

Each of memory cells 102 can be configured (e.g., structured) to store more than one bit of information. Information stored in memory cells 102 can be read-only information. Memory cells 102 can include one-time programmable memory cells, such that the value of information stored in memory cells 102 may be fixed, which is unchangeable (e.g., may not be updated) after the information is stored in memory cells 102. In an alternative arrangement, memory cells 102 can include multiple-time programmable memory cells, such that the value of information stored in memory cells 102 may be changed (e.g., may be updated) after the information is stored in memory cells 102.

One skilled in the art would recognize that a memory device (e.g., a ROM device) such as memory device 100 includes many additional components, several of which are not shown in FIG. 1 so as not to obscure the embodiments described herein. Memory device 100 can include a memory device described below with reference to FIG. 2 through FIG. 12.

Figure 2:
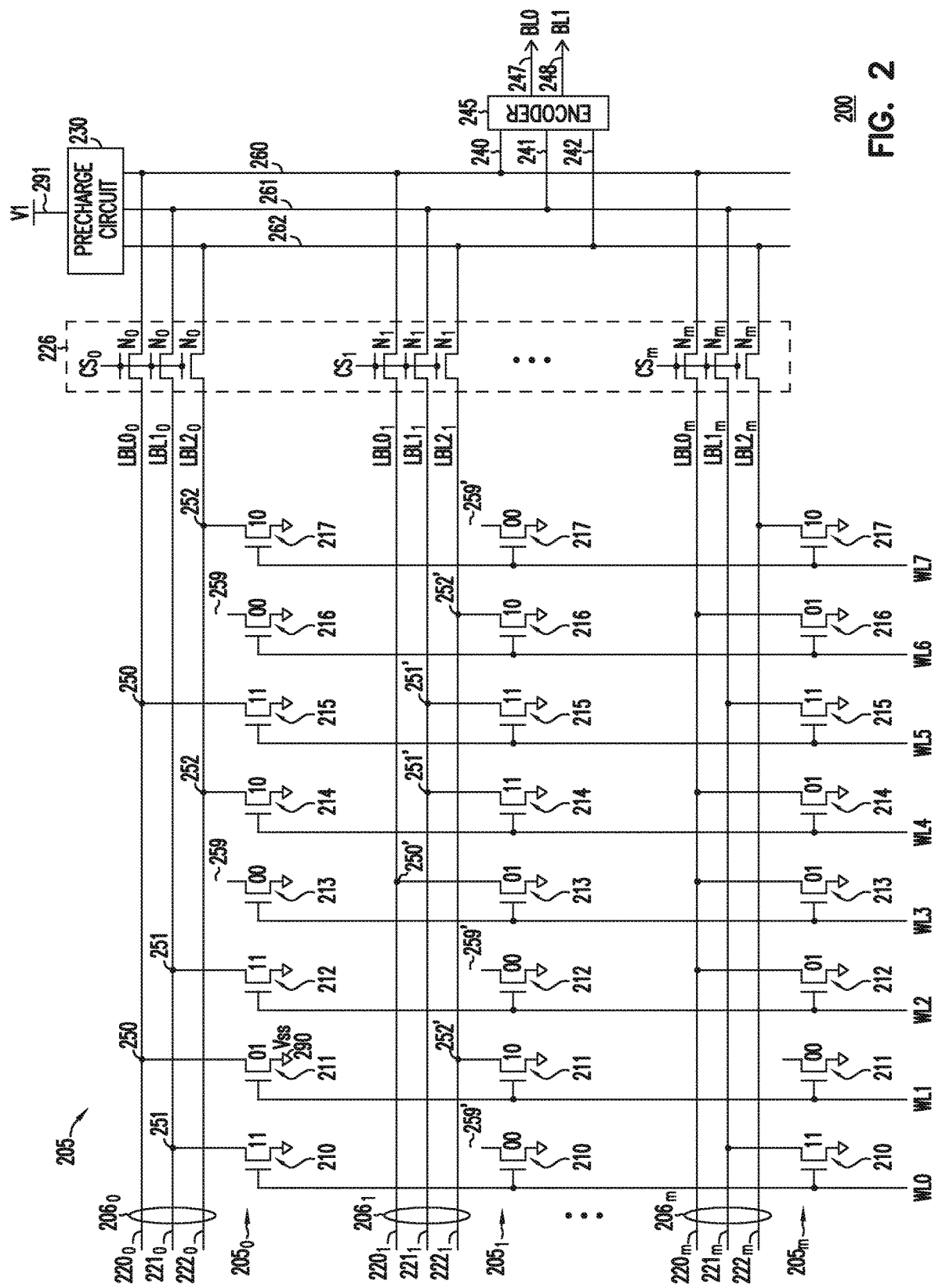
FIG. 2 shows a schematic diagram of a memory device including non-volatile memory cells where each memory cell can be configured support four logic states to store two bits of information in each memory cell, according to some embodiments described herein.

FIG. 2 shows a schematic diagram of a memory device 200 including non-volatile memory cells 210-217 where each of memory cells 210-217 can be configured support four logic states to store two bits of information, according to some embodiments described herein. Memory device 200 can correspond to memory device 100 of FIG. 1.

As shown in FIG. 2, memory device 200 can include a memory array 205 having memory cell groups (e.g., memory cell columns) $205_0$, $205_1$, and $205m$ ($205_0$ through $205_m$), access lines (e.g., word lines) and associated signals (e.g., word line signals) WL0 through WL7, data line sets (e.g., local data line sets) $206_0$, $206_1$, and $206_m$ ($206_0$ through $206_m$) a gating circuit 226, a precharge circuit 230, and an encoder 245.

Memory device 200 can have an equal number of memory cells (e.g., memory cells 210-217) in each of memory cell groups $205_0$, $205_1$, and $205_m$. FIG. 2 shows memory device 200 having three memory group as an example. Memory device 200 can include a number of m memory cell groups where m is an integer greater than one. FIG. 2 shows eight memory cells 210-217 in each of memory cell groups $205_0$, $205_1$, and $205_m$. However, the number of memory cells in each of memory cell group can be different from eight.

Each of memory cells 210-217 of memory device 200 can include a transistor. FIG. 2 shows an example of n-channel metal-oxide semiconductor (NMOS) transistor for each of memory cells 210-217 of memory device 200. The transistor of each of the memory cells of memory device 200 can include Fin Field-effect transistor (FinFET) structure or other transistor structures. FIG. 2 shows each of memory cells 210-217 includes an NMOS transistor as an example. Other types of transistors can be used. For example, each of memory cells 210-217 in an alternative structure of memory device 200 can include a p-channel metal-oxide semiconductor (PMOS) transistor. In the alternative structure, the type (e.g., at least one of transistor type) of devices in peripheral circuits (e.g., one or more of gating circuit 226 and precharge circuit 230) of memory device 200 can be exchanged from one type to another (e.g., from n-type to p-type and from p-type to n-type).

Data line sets lines (e.g., local bit line sets) $206_0$, $206_1$, and $206_m$ can have an equal number of three data lines in each of data line sets $206_0$, $206_1$, and $206_m$. As shown in FIG. 2, memory device 200 can include data lines $220_0$, $221_0$, and $222_0$ (which form data line set $206_0$), data lines $220_1$, $221_1$, and $222_1$ (which form data line set $206_1$), and data lines $220_m$, $221_m$, and $222_m$ (which form data line set $206_m$). Memory device 200 includes the same number of data lines (three data lines) in each of data line sets $206_0$, $206_1$, and $206_m$. The number of data lines in each of data line sets $206_0$, $206_1$, and $206_m$ is fixed at three. However, the number of data line sets can vary and can be equal to the number of memory cell groups. For example, FIG. 2 shows an example of three data line sets $206_0$, $206_1$, and $206_m$ because three memory cell groups $205_0$, $205_1$, and $205_m$ are shown in FIG. 2. If memory device 200 has m memory cell groups, then the number of data line sets would also be m. For example, if memory device 200 has 32 (e.g., m=32) memory cell groups, then the number of data line sets would also be 32. In this example (32 memory cell groups), the total number of data lines (e.g., local bit lines) is 96 (32×3 data lines in each data line set=96 data lines)

The data lines in each data line set can carry information (e.g., data) represented by bits (e.g., bits of information). As shown in FIG. 2, data lines $220_0$, $221_0$, and $222_0$ can carry bits $LBL0_0$, $LBL1_0$, and $LBL2_0$, respectively. Data lines $220_1$, $221_1$, and $222_1$ can carry bits $LBL0_1$, $LBL1_1$, and $LBL2_1$, respectively. Data lines $220_m$, $221_m$, and $222_m$ can carry bits $LBL0_m$, $LBL1_m$, and $LBL2_m$, respectively. In a read operation of memory device 200, the values (e.g., binary value "0" or "1") of the bits in a particular data line set (e.g., bits $LBL0_0$, $LBL1_0$, and $LBL2_0$ of data line set $206_0$) can be based on the value of information stored (e.g., previously stored) in a selected memory cell of a memory cell group (memory cell group $205_0$) assigned to that particular data line set.

Memory device 200 can selectively activate (e.g., activate one at a time) signals WL0 through WL7 to select one of memory cell among memory cells 210-217 of a particular memory cell group to be a selected memory cell to read information from the selected memory cell. For example, if memory cell 210 of memory cell group $205_0$ is to be selected during a read operation, memory device 200 can activate signal WL0 (and deactivate signals WL1 through WL7 while signal WL0 is activated) to select memory cell 210 of memory cell group $205_0$.

The values of bits $LBL0_0$, $LBL1_0$, and $LBL2_0$ can be based on the signal levels (e.g., voltage levels) on data lines $220_0$, $221_0$, and $222_0$, respectively. During a read operation to read information from a selected memory cell among memory cells 210-217 of memory cell group $205_0$, the signal level on each of data lines $220_0$, $221_0$, and $222_0$ (e.g., during an evaluation stage of the read operation) can be based on the value (e.g., binary value) of information stored (previously stored) in the selected memory cell of memory cell group $205_0$.

Similarly, the values of bits $LBL0_1$, $LBL1_1$, and $LBL2_1$ can be based on the signal levels (e.g., voltage levels) on data lines $220_1$, $221_1$, and $222_1$, respectively. During a read operation to read information of a selected memory cell among memory cells 210-217 of memory cell group $205_1$, the signal level on each of data lines $220_1$, $221_1$, and $222_1$ (e.g., during an evaluation stage of the read operation) can be based on the value (e.g., binary value) of information stored (previously stored) in the selected memory cell of memory cell group $205_1$. The values of bits $LBL0_m$, $LBL1_m$, and $LBL2_m$ can be based on the signal levels (e.g., voltage levels) on data lines $220_m$, $221_m$, and $222_m$, respectively. During a read operation to read information of a selected memory cell among memory cells 210-217 of memory cell group $205_m$, the signal level on each of data lines $220_m$, $221_m$, and $222_m$ (e.g., during an evaluation stage of the read operation) can be based on the value (e.g., binary value) of information stored (previously stored) in the selected memory cell.

Each of memory cells 210-217 of memory device 200 can be configured to support four logic states that can correspond to four possible values (e.g., "00", "01", "10", and "11") of a combination of two binary values (e.g., the values of two bits). Thus, each of memory cells 210-217 can store two bits of information. The value of information stored in each of memory cells 210-217 can be any value among the four possible values (e.g., "00", "01", "10", and "11") of two bits.

FIG. 2 shows example values of information stored (e.g., permanently stored) in memory cells 210-217 of memory device 200. As shown in FIG. 2, the values of two bits of information stored in memory cells 210-217 do not follow a particular pattern. The stored values of two bits are based on predetermined values (e.g., user-defined values) to be stored in memory cells 210-217. As shown in FIG. 2, the values of information stored in respective memory cells 210-217 of groups $205_0$ are (from left to right) "11", "01", "11", "00", "10", "01", "00", and "10". FIG. 2 also shows other example values of two bits of information stored in memory cells 210-217 of each of memory cell groups $205_1$ and $205_m$.

In memory device 200, storing a value (one of four values "00", "01", "10", and "11") of information (two bits of information) in a particular memory cell of a memory cell group can be performed (e.g., programmed) by either forming an electrical connection between that particular memory cell and one (only one) of three data lines of the data line set assigned to that memory cell group or forming no electrical connection (not to form an electrical connection) between that particular memory cell and all three data lines of the data line set assigned to that memory cell group. Selecting which data line among the three data lines to form the electrical connection (or not to form an electrical connection) with a particular memory cell is based on the value of information (e.g., "00", "01", "10", and "11") to be stored in that particular memory cell, as described in more detail below with reference to a chart shown in FIG. 3.

FIG. 2 shows examples of electrical connections and no electrical connections (e.g., gaps) between respective memory cells 210-217 and data line sets $206_0$, $206_1$, and $206_m$ of memory device 200 based on the values of information stored in the respective memory cells of memory devices. For example, FIG. 2 shows connections 250, 251, 252, and 253 connections between some of the memory cells 210-217 of memory cell group $205_0$ and some of data lines $220_0$, $221_0$, and $221_0$. FIG. 2 also shows no connections (no electrical connections (e.g., gaps)) 259 between each of memory cells 210 and 213 of memory cell group $205_0$ and data lines $220_0$, $221_0$, and $221_0$. In memory cell group $205_1$, example connections (based on stored values in memory cells 210-217 of memory cell group $205_1$) include connections 250', 251', and 252' and no connections 259'. FIG. 2 omits labels at the connections in memory cell group $205_m$ for simplicity.

In FIG. 2, an electrical connection (e.g., connection 250, 251, or 252) can be formed by forming a conductive path (e.g., conductive contact) between a terminal (e.g., a drain region of the NMOS transistor) of the NMOS transistor of the memory cell and a data line of the data line set.

For example, at memory cells 210 and 212 of memory cell group $205_0$, connection 251 can be formed between a drain region of the NMOS transistor of memory cell 210 and data line $221_0$, and another connection 251 can be formed between a drain region of the NMOS transistor of memory cell 212 and data line $221_0$. In this description, the drain region (drain terminal) of a transistor is occasionally called the drain.

At memory cells 211 and 215 of memory cell group $205_0$, connection 250 can be formed between a drain region of the NMOS transistor of memory cell 211 and data line $220_0$, and another connection 250 can be formed between a drain region of the NMOS transistor of memory cell 215 and data line $220_0$.

At memory cells 214 and 217 of memory cell group $205_0$, connection 252 can be formed between a drain region of the NMOS transistor of memory cell 214 and data line $222_0$, and another connection 252 can be formed between a drain region of the NMOS transistor of memory cell 217 and data line $222_0$.

At each of memory cells 213 and 216 no connection 259 is formed between a drain region of the NMOS transistor of each of memory cells 213 and 216 and any of data lines $220_0$, $221_0$, and $220_0$.

Similarly, FIG. 2 show example values of information stored in memory cells 210-217 of each of the other memory cell groups $205_1$ and $205_m$ of memory device 200.

Thus, as shown in FIG. 2, different memory cells within the same memory cell group can have the same electrical connection (or not to have an electrical connection) with the data line set assigned to that memory cell group if the memory cells are to store information having the same value. The memory cells can have different connections with the data line set if the memory cells store information having different values.

As described above, depending on the value of information stored in a particular memory cell, either no electrical connection exists between that particular memory cell and any data line among the three data lines of a data line set or an electrical connection exists between that particular memory cell and at most one (only one) data line among the three data lines of a data line set.

As shown in FIG. 2 gating circuit 226 can include transistors $N_0$, $N_1$, and $N_m$ ($N_0$ through $N_m$). Each of transistors $N_0$ includes a gate (transistor gate). The gates of transistors $N_0$ are coupled (electrically coupled) to each other to receive (and to be controlled by) the same signal (e.g., signal $CS_0$). Each of transistors $N_1$ includes a gate (transistor gate). The gates of transistors $N_1$ are coupled (electrically coupled) to each other to receive (and to be controlled by) the same signal (e.g., signal $CS_1$). Each of transistors $N_m$ includes a gate (transistor gate). The gates of transistors $N_m$ are coupled (electrically coupled) to each other to receive (and to be controlled by) the same signal (e.g., signal $CS_m$). The gates of transistors $N_0$ are electrically separated from the gates of transistors $N_1$ and the gates of transistors $N_m$.

Gating circuit 226 can control (e.g., turn on or turn off) transistors $N_0$, $N_1$, and $N_m$ based on signals (e.g., column select signals) $CS_0$, $CS_1$, and $CS_m$ ($CS_0$ through $CS_m$), respectively. Signals $CS_0$, $CS_1$, and $CS_m$ can be similar to signals $CS_0$ through $CS_m$ of memory device 100 of FIG. 1. Signals $CS_0$, $CS_1$, and $CS_m$ can be activated one signal at time. For example, when signal $CS_0$ is activated, signals $CS_1$ and $CS_m$ are deactivated; when signal $CS_1$ is activated, signals $CS_0$ and $CS_m$ are deactivated; and when signal $CS_m$ is activated, signals $CS_0$ and $CS_1$ are deactivated.

In FIG. 2, transistors $N_0$ can all be turned on when signal $CS_0$ is activated and all be turned off when signal $CS_0$ is deactivated. Transistors $N_1$ can all be turned on when signal $CS_1$ is activated and all be turned off when signal $CS_1$ is deactivated. Transistors $N_m$ can all be turned on when signal $CS_m$ is activated and all be turned off when signal $CS_m$ is deactivated.

Gating circuit 226 can activate signal $CS_0$ to turn on transistors $N_0$ during a stage (e.g., an evaluation stage after a precharge stage) of a read operation to read information from a selected memory cell of memory cell group $205_0$. Conductive lines 260, 261, and 262 are electrically coupled to data lines $220_0$, $221_0$, $222_0$, respectively, when transistors $N_0$ are turned on. Thus, during a read operation to read information from a selected memory cell of memory cell group $205_0$, conductive lines 260, 261, and 262 can be considered as part of data lines (e.g., local data lines) $220_0$, $221_0$, and $222_0$, respectively. Therefore, the signal levels (e.g., voltage levels) on conductive lines 260, 261, and 262 can be based on the signal levels on data lines $220_0$, $221_0$, and $222_0$, respectively, when transistors $N_0$ are turned on.

Similarly, gating circuit 226 can activate signal $CS_1$ to turn on transistors $N_1$ during a stage (e.g., an evaluation stage after a precharge stage) of a read operation to read information from a selected memory cell of memory cell group $205_1$. Conductive lines 260, 261, and 262 are electrically coupled to data lines $220_1$, $221_1$, and $221_1$, respectively, when transistors $N_1$ are turned on. Thus, during a read operation to read information from a selected memory cell of memory cell group $205_1$, conductive lines 260, 261, and 262 can be considered as part of data lines (e.g., local data lines) $220_1$, $221_1$, and $222_1$, respectively. Therefore, the signal levels (e.g., voltage levels) on conductive lines 260, 261, and 262 can be based on the signal levels on data lines $220_1$, $221_1$, and $222_1$, respectively, when transistors $N_0$ are turned on.

Gating circuit 226 can activate signal $CS_m$ to turn on transistors $N_m$ during a stage (e.g., an evaluation stage after a precharge stage) of a read operation to read information from a selected memory cell of memory cell group $205_m$. Conductive lines 260, 261, and 262 are electrically coupled data lines $220_m$, $221_m$, and $222_m$, respectively, when transistors $N_m$ are turned on. Thus, during a read operation to read information from a selected memory cell of memory cell group $205_m$, conductive lines 260, 261, and 262 can be considered as part of data lines (e.g., local data lines) $220_m$, $221_m$, and $222_m$, respectively. Therefore, the signal levels (e.g., voltage levels) on conductive lines 260, 261, and 262 can be based on the signal levels on data lines $220_m$, $221_m$, and $222_m$, respectively, when transistors $N_m$ are turned on.

In FIG. 2, precharge circuit 230 can operate to charge (e.g., during a precharge stage of a read operation) conductive lines 260, 261, and 262 to a precharge voltage level (e.g., 1.2V), which can be equal to the voltage level of voltage V1 at node (e.g., supply node) 291. Voltage V1 can be a supply voltage (e.g., Vcc) of memory device 200. During a stage (an evaluation stage after a precharge stage) of a read operation, each of conductive lines 260, 261, and 262 can either maintain (remain at) the precharge voltage level (e.g., 1.2V) or discharge (decrease) to a voltage Vss (e.g., ground) at node 290 depending on the value of information stored in the selected memory cell. In FIG. 2, only one node 290 (e.g., ground node) is labeled for simplicity.

The voltage level on a particular conductive line (one of conductive lines 260, 261, and 262) during an evaluation stage of a read operation can remain at the precharge voltage level (e.g., level of voltage V1) if no electrical connection is present between a selected memory cell and the data line coupled to that particular conductive line. For example, if memory cell 213 of memory cell group $205_0$ is selected (to read information from the selected memory cell 213), then each of conductive lines 260, 261, and 262 can remain at the precharge voltage level (because no electrical connection exists between node 290 and each of data lines $220_0$, $221_0$, and $222_0$ through memory cell 213).

The voltage level on a particular conductive line (one of conductive lines 260, 261, and 262) during an evaluation stage of a read operation can decrease to ground (e.g., 0V) if an electrical connection is present between a selected memory cell and the data line coupled to that particular conductive line. For example, if memory cell 210 of memory cell group $205_0$ is selected, then conductive line 261 can discharge to node 290 (e.g., ground) through memory cell 210 (because an electrical connection exists between data line $221_0$ and node 290 through memory cell 210). In this example, each of conductive lines 260 and 262 can remain at the precharge voltage level (because no electrical connection exists between node 290 and each of data lines $220_0$ and $222_0$ through memory cell 210).

The voltage levels (e.g., either precharge voltage level or ground) on conductive lines 260, 261, and 262 can represent the values (binary values "0" and "1") of bits $LBL0_0$, $LBL1_0$, and $LBL2_0$, respectively, if a memory cell in memory cell group $205_0$ is selected. The voltage levels on conductive lines 260, 261, and 262 can represent the values of bits $LBL0_1$, $LBL1_1$, and $LBL2_1$, respectively, if a memory cell in memory cell group $205_1$ is selected. The voltage levels on conductive lines 260, 261, and 262 can represent the values of bits $LBL0_m$, $LBL1_m$, and $LBL2_m$, respectively, if a memory cell in memory cell group $205_m$ is selected.

Memory cell groups $205_0$, $205_1$, and $205_m$, can share encoder 245. As shown in FIG. 2, encoder 245 can include input nodes 240, 241, and 242 that can be selectively coupled (electrically coupled) to the three respective data lines of each of data line sets $206_0$, $206_1$, and $206_m$, (through respective conductive lines 260, 261, and 262 and through turned-on transistors $N_0$, transistors $N_1$, or transistors $N_m$).

Input nodes 240, 241, and 242 of encoder 245 can receive (e.g., receive in parallel) three bits (e.g., bits $LBL0_0$, $LBL1_0$, and $LBL2_0$) from the three respective data lines of a data line set. Encoder 245 can include output nodes 247 and 248 to provide (e.g., provide in parallel) bits BL0 and BL1. The three bits at input nodes 240, 241, and 242 of encoder 245 can be a certain scheme (e.g., at most one of the three bits has a binary value of "0") and the output of encoder 245 at nodes 247 and 248 is two binary bits (e.g., bits BL0 and BL1). The three bits at input nodes 240, 241, and 242 can represent input information (e.g., input bits) provided to encoder 245. The two bits (BL0 and BL1) at output nodes 247 and 247 can represent output information (e.g., output bits) provided (e.g., generated) by encoder 245. Encoder 245 can include logic circuitry (e.g., logic gates) that can perform logic operations on the three bits received at input nodes 240, 241, and 242. The value (e.g., "0" or "1") of each of bits BL0 and BL1 is based on the result of the logic operations. The value (e.g., "00", "01", "10", or "11") of bits BL0 and BL1 reflects the value (e.g., "00", "01", "10", or "11") of information stored in a selected memory cell.

During a read operation to read information from selected memory cells among memory cells 210-217, precharge circuit 130 can charge conductive lines 260, 261, and 262 to a precharge voltage level (e.g., Vcc) during a stage (e.g., a precharge stage) of the read operation. Gating circuit 226 can respond to signals $CS_0$, $CS_1$, and $CS_m$ to selectively turn on transistors $N_0$, $N_1$, and $N_m$ to electrically couple a selected data line set (e.g., data line set $206_0$) among data line sets $206_0$, $206_1$, and $206_m$ to conductive lines 260, 261, and 262. Encoder 245 can perform logic operations on the bits (e.g., $LBL0_0$, $LBL1_0$, and $LBL2_0$) on the selected data line set (e.g., data line set $206_0$) and generate bits BL0 and BL1. The values of bits BL0 and BL1 can be based on the values of information (e.g., previously stored information) read from a selected memory cell among memory cells 210-217. An output circuit (not shown) of memory device 200 can receive bits BL0 and BL1 for further processing. Logic operations performed by encoder 245 to generate bits BL0 and BL1 is described below.

FIG. 3 is a chart 345 showing four logic states and corresponding binary values that can be stored in a memory cell of memory device 200 of FIG. 2, and encoding values corresponding to the logic states, according to some embodiments described herein. Chart 345 shows four logic states. The four logic states of chart 345 can be created based on four possible logic states obtaining from connections of one memory cell with three data lines of a data line set. As described above, at most one electrical connection (or no electrical connection) can be formed between a memory cell and associated three data lines. Thus, one memory cell and three data lines can provide four possible logic states based on this connection arrangement.

In FIG. 3, four logic states 1, 2, 3, and 4 can correspond to (e.g., can be assigned to) four possible values "01", "11", "10", and "00", respectively, of two bits that can be stored in a memory cell (one of memory cells 210-217 in FIG. 2) of memory device 200.

Bits LBL0, LBL1, and LBL2 in chart 345 can represent the three bits of a data line set (e.g., data line set $206_0$, $206_1$, and $206_m$) of memory device 200 in FIG. 2. Thus, bits LBL0, LBL1, and LBL2 can represent bits $LBL0_0$, $LBL1_0$, and $LBL2_0$, respectively, represent bits $LBL0_1$, $LBL1_1$, and $LBL2_1$, respectively, and represent bits $LBL0_m$, $LBL1_m$, and $LBL2_m$, respectively.

As shown in FIG. 3, bits LBL0, LBL1, and LBL2 can have different values (e.g., different combinations of "0" and "1") based on the value ("01", "11", "10", or "00") of information stored in a memory cell (any of memory cells 210-217) of memory device 200. For example, bits LBL2, LBL1, and LBL0 can have values "1", "1", and "0", respectively, if the value stored in a memory cell of memory device 200 is "01". In another example, bits LBL2, LBL1, and LBL0 can have values "1", "1", and "1", respectively, if the value stored in a memory cell is "00".

Chart 345 also shows the values for bits BL0 and BL1 (e.g., output information) that can be obtained based on logic operations (e.g., logic NAND operations) performed by encoder 245 on bits LBL0, LBL1, and LBL2 (e.g., input information). As shown in FIG. 3, the value of bit BL0 can be based on NAND<LBL1, LBL0>, which is logic operation NAND (i.e., not AND) on bits LBL1 and LBL0. The value of bit BL1 can be based on NAND<LBL2, LBL1>, which is logic operation NAND on bits LBL2 and LBL1. As shown in chart 345, the logic operations (logic operations NAND<LBL2, LBL1> and NAND<LBL1, LBL0> performed by encoder 245) on bits LBL0, LBL1, and LBL2 can provide all possible four values ("01", "11", "10", and "00") in the form of the values of bits BL0 and BL1. Thus, the logic operations performed on bits LBL0, LBL1, and LBL2 can determine which value (e.g., "01", "11", "10", and "00") was stored in a particular memory cell of memory device 200.

The combinations of values "0" and "1" (e.g., encoding values) associated with bits LBL0, LBL1, and LBL2 can also be used to program a particular memory cell. As described above, programming (e.g., storing information in) a particular memory cell can include either forming an electrical connection between that particular memory cell and one of (only one of) the data line of a data line set or forming no electrical connection (not to form an electrical connection) between that particular memory and all of the data lines of a data line. In chart 345 of FIG. 3, for a given state, value "0" associated with a particular bit among bits LBL0, LBL1, or LBL2 can indicate forming an electrical connection between a particular memory cell and the data line associate with that particular bit. For a given state, value "1" associated with a particular bit among bits LBL0, LBL1, or LBL2 can indicate forming no electrical connection between a particular memory cell and the data line associate with that particular bit.

In FIG. 2, the presence or absence of an electrical connection between a particular memory cell (one of memory cells 210-217) and a corresponding data line set is based on values "0" and "1" associated with bits LBL0, LBL1, or LBL2 of chart 345. For example, in FIG. 2, since memory cell 211 of memory cell group $205_0$ stores information having a value of "01", forming or not forming an electrical connection between memory cell 214 is based on the value of "110" (corresponding to logic state 1) of bits LBL2, LBL1, and LBL0. Thus, programming memory cell 211 (to store value "01") can include (as shown in FIG. 2) forming a connection 250 between memory cell 211 and data line $220_0$ (because LBL0="0" for logic state corresponding to "01" in chart 345), forming no electrical connection between memory cell 211 and data line $221_0$ (because LBL1="1" for logic state corresponding to "01" in chart 345), and forming no electrical connection between memory cell 211 and data line $222_0$ (because LBL2="1" for logic state corresponding to "01" in chart 345).

Similarly, other memory cells 210-217 of memory device 200 can include no electrical connections and electrical connections with respective data line sets $206_0$, $206_1$, and $206_m$ based on the values of bits LBL0, LBL1, and LBL2 of chart 345.

In memory device 200 described above with reference to FIG. 2 and FIG. 3, the memory cells (e.g., memory cells 210-217) can be configured (e.g., formed) to have one threshold voltage (e.g., instead of multiple threshold voltage voltages) for different values of information to be stored in the memory cell. For example, memory device 200 can use one voltage (e.g., a single reference point) during a read operation (as described above) to determine the value (e.g., "00", "01", "10", or "11") of information stored (e.g., previously stored) in a selected memory cell (or memory cells). Thus, the process of making memory device 200 can avoid additional tasks such as tuning threshold voltages for different values of information. Further, since a single voltage (e.g., a single reference point) can be used, memory device 200 may avoid complex sensing circuitry. Moreover, since more than one bit can be stored in a memory cell of memory device 200, the device area (for a given storage density) of memory device 200 can be smaller than the device area of some conventional memory devices.

As described above with reference to FIG. 2 and FIG. 3, each of memory cells 210-217 can be configured (e.g., by forming electrical connections or forming no electrical connections) with three data lines to enable each of memory cells 210-217 to store two bits of information. The description below describes a memory device that include memory cell pairs where each of the memory cell pair (two memory cells) can be configured to support more than four logic states.

Figure 4:
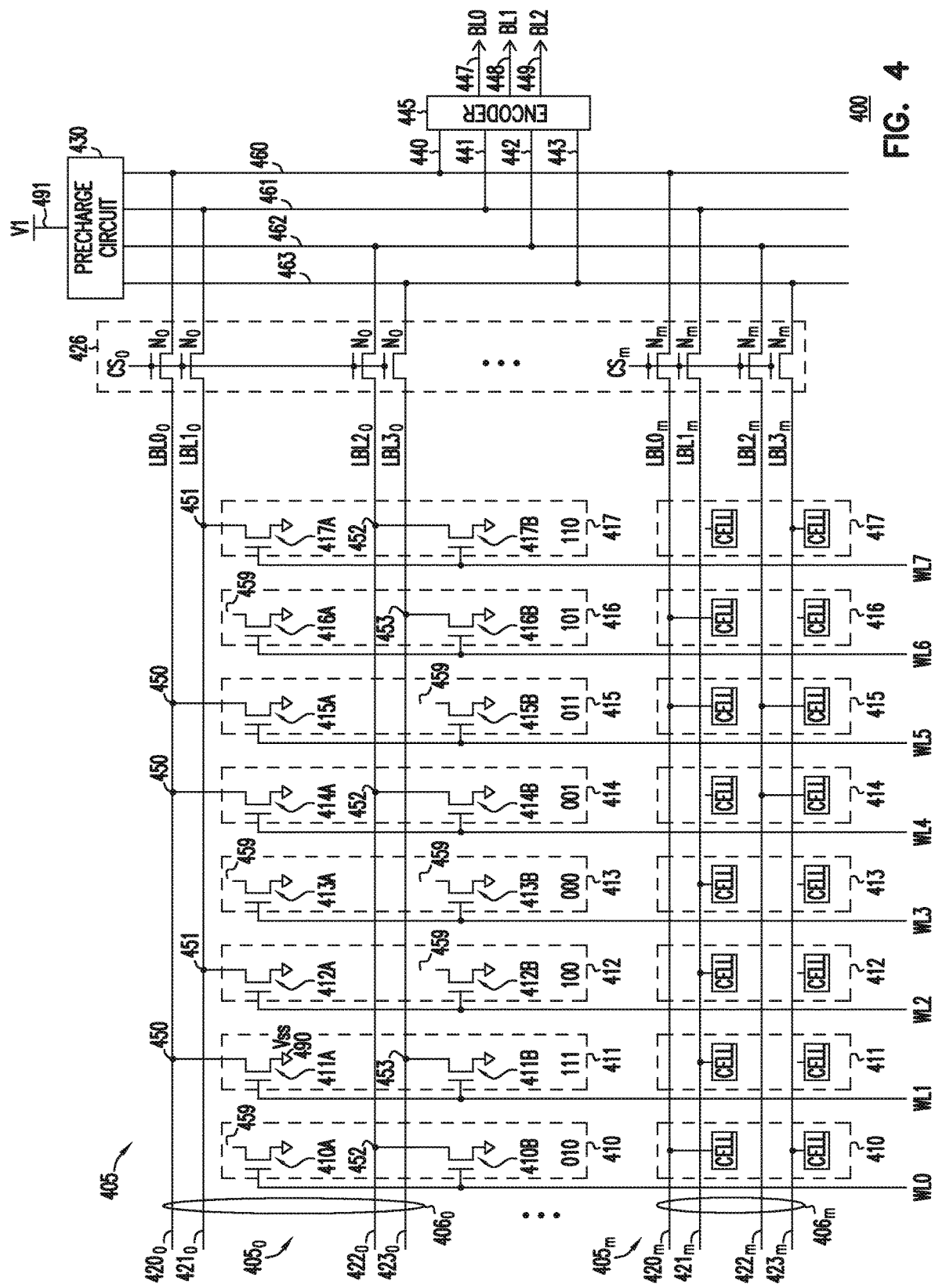
FIG. 4 shows a schematic diagram of a memory device including non-volatile memory cell pairs where each memory cell pair can be configured to support eight logic states to store three bits of information in each memory cell pair, according to some embodiments described herein.

FIG. 4 shows a schematic diagram of a memory device including non-volatile memory cell pairs 410-417 where each of the memory cell pair can be configured to support eight logic states to store three bits of information, according to some embodiments described herein. Memory device 400 can correspond to memory device 100 of FIG. 1 and can be a variation of memory device 200 of FIG. 2. As shown in FIG. 4, memory device 400 can include a memory array 405 (which includes memory cell groups $405_0$ through $405_m$), access lines (e.g., word lines) and associated signals (e.g., word line signals) WL0 through WL7, data line sets (e.g., local data line sets) $406_0$ through $406_m$, a gating circuit 426, a precharge circuit 430, and an encoder 445.

Differences between memory devices 200 and 400 include a difference in the storage capacity of the memory cells of memory devices 200 and 400. As described above, each of memory cells 210-217 of memory device 200 of FIG. 2 can be configured support four logic states that can be used to represent to four values "00", "01", "10", and "11" of two bits. Thus, each of memory cells 210-217 of memory device 200 can store two bits of information.

In FIG. 4, each of memory cell groups $405_0$ and $405_m$ can include memory cell pairs 410-417. Each of memory cell pairs 410-417 can be configured to support eight logic states that can be used to represent eight possible values (e.g., "000", "001", "010", "011", "100", "101", "110", and "111") of a combination of three binary values (e.g., three bits). Thus, each memory cell pair of memory cell pairs 410-217 can store three bits (more than one bit) of information, where the stored value can be any value among the eight possible values (e.g., "000", "001", "010", "011", "100", "101" "110", and "111")of three bits. Since each of memory cell pairs 410-417 includes two memory cells and each memory cell pair can store three bits of information, each memory cell of the memory cell pair can store 1.5 bits (more than one bit) of information.

Memory device 400 can have an equal number of memory cell pairs in each of memory cell groups $405_0$ through $405_m$ (where m can represent a total number of memory cell groups). FIG. 4 shows eight memory cell pairs 410-417 (e.g., 16 memory cells) in each of memory cell groups $405_0$ through $405_m$. However, the number of memory cell pairs in each of memory cell group can be different from eight. As shown in FIG. 4, each memory cell pair can include two memory cells. For example, memory cell pair 410 of memory cell group $405_0$ can include memory cells 410A and 410B. Similarly, memory cell pairs 411 through 417 of memory cell group $405_0$ can include memory cells 411A and 411B through 417A and 417B, respectively. For simplicity, FIG. 4 shows the each of the two memory cells of each of memory cell pairs 410-417 of memory cell group $405_m$ as "CELL" (without numerical labels).

Memory device 400 can include data lines (e.g., local bit lines) that can be divided into data line sets $406_0$ through $406_m$. Memory device 400 can have an equal number of four data lines in each of data line sets $406_0$ through $406_m$. As shown in FIG. 4, memory device 400 can include data lines $420_0$, $421_0$, $422_0$, and $423_0$ (which form data line set $406_0$), and data lines $420_m$, $421_m$, $422_m$, and $423_m$ (which form data line set $406_m$). Memory device 400 includes the same number of four data lines in each of data line sets $406_0$ through $406_m$. The number of data lines in each of data line sets $406_0$ through $406_m$ is fixed at four.

The data lines in each data line set can carry information (e.g., data) represented by bits (e.g., bits of information). As shown in FIG. 4, data lines $420_0$, $421_0$, $422_0$, and $423_0$ can carry bits $LBL0_0$, $LBL1_0$, $LBL2_0$, $LBL3_0$, respectively. Data lines $420_m$, $421_m$, $422_m$, and $423_m$ can carry bits $LBL0_m$, $LBL1_m$, $LBL2_m$, $LBL3_1$, respectively. The values of bits $LBL0_0$, $LBL1_0$, $LBL2_0$, $LBL3_0$, can be based on the signal levels (e.g., voltage levels) on data lines $420_0$, $421_0$, $422_0$, and $423_0$, respectively. The values of bits $LBL0_m$, $LBL1_m$, $LBL2_m$, $LBL3_m$ can be based on the signal levels (e.g., voltage levels) on data lines $420_m$, $421_m$, $422_m$, and $423_m$ respectively. During a read operation to read information from a selected memory cell among memory cells 410-417 of memory cell group $405_0$, the signal level on each of data lines $420_0$, $421_0$, $422_0$, and $423_0$, (e.g., during an evaluation stage of the read operation) can be based on the value (e.g., binary value) of information stored (previously stored) in the selected memory cell of memory cell group $405_0$. During a read operation to read information from a selected memory cell among memory cells 410-417 of memory cell group $405_m$, the signal level on each of data lines $420_m$, $421_m$, $422_m$, and $423_m$ (e.g., during an evaluation stage of the read operation) can be based on the value (e.g., binary value) of information stored (previously stored) in the selected memory cell of memory cell group $405_m$.

Each of data line sets $406_0$ through $406_m$ can be assigned to (e.g., can be associated) with one of memory cell group $405_0$ through $405_m$. As shown in FIG. 4, data line set $406_0$ can be assigned to memory cell group $405_0$. Data line set $406_0$ can be assigned to memory cell group $405_m$.

In memory device 400, each memory cell of a particular memory cell pair can be associated with two of the four data lines of a data line sets. For example, memory cell 410A can be associated with data lines $420_0$ and $421_0$, and memory cell 410B can be associated with data lines $422_0$ and $423_0$. In another example, memory cell 417A can be associated with data lines $420_0$ and $421_0$, and memory cell 417B can be associated with data lines $422_0$ and $423_0$.

FIG. 4 shows example values of three bits of information stored (e.g., permanently stored) in memory cell pairs 410-

417 of memory device 400. The stored values do not follow a particular pattern. They are based on predetermined values. As shown in FIG. 4, memory cell pairs 410-471 of memory cell group $405_0$ stores values "010", "111", "100", "000", "001", "011", "101", and "110", respectively.

Storing a value (one of eight values "000", "001", "010", "011", "100", "101", "110", and "111") of information in a particular memory cell pair can be performed (e.g., programmed) by forming only one connection (or alternatively forming no electrical connection) between one memory cell (e.g., memory cell 410A) of that particular memory cell pair and two data lines (e.g., $420_0$ and $421_0$) assigned to that memory cell, and forming only one electrical connection (or alternatively forming no electrical connection) between the other memory cell (e.g.. memory cell 410B) of that particular memory cell pair and two data lines (e.g., $422_0$ and $423_0$) assigned to the other memory cell. Selecting which data line among the four data lines to form the electrical connection (or not to form an electrical connection) with a particular memory cell is based on the value of information (e.g., values "000", "001", "010", "011", "100", "101", "110", and "111") to be stored in that particular memory cell, as described in more detail below with reference to a chart shown in FIG. 4.

FIG. 4 shows examples of electrical connections 450, 451, 452, and 453 between some of the memory cells of memory cell pairs 410 and 417 and some of data lines $420_0$, $421_0$, $422_0$, and $423_0$ of data line set $406_0$. FIG. 4 also shows no electrical connections (e.g., gaps) 459. Each of memory cell pairs 410-417 of memory cell group $405_m$ also stores information having values indicated by the presence or absence of electrical connections between memory cell pairs 410-417 of memory cell group $405_m$ and data line set $406_m$. For simplicity, FIG. 4 omits labels of electrical connections and no electrical connections between memory cell pairs 410-417 of memory cell group $405_m$ and data line set $406_m$.

The operation of memory device 400 can be similar to that of the operation of memory device 200. For example, when a memory cell pair of memory cell group $405_0$ is selected to during a read operation to read information from the selected memory cell pair, signal $CS_0$ can be activated after precharge circuit 430 charges conductive lines 460, 461, 462, and 463 to a precharge voltage level, which can be the level of voltage V1 (e.g., Vcc) at node 491. Transistors No are turned on (because signal $CS_0$ is activated) and electrically couple conductive lines 460, 461, 462, and 463 to data lines $420_0$, $421_0$, $422_0$, and $423_0$, respectively, (through respective transistors $N_0$, which are turned on). At least two of conductive lines 460, 461, 462, and 463 can remain at the precharge voltage level (e.g., voltage V1) or at most two of conductive lines 460, 461, 462, and 463 can discharge to voltage Vss (e.g., ground) at a node 490, depending on the value of information stored in the selected memory cell pair. When signal $CS_0$ is activated, signal $CS_m$ is not activated and transistors $N_m$ are not turned on.

Encoder 445 receives bits $LBL0_0$, $LBL1_0$, $LBL2_0$, and $LBL3_0$ at its input nodes 440, 441, 442, and 443, respectively (through conductive lines 460, 461, 462, and 463, respectively). Encoder 445 can include logic circuitry to perform logic operations on bits $LBL0_0$, $LBL1_0$, $LBL2_0$, and $LBL3_0$ and provide bits BL0, BL1, and BL2 at output nodes 447, 448, and 449, respectively. The four bits at input nodes 440, 441, 442, and 443 can represent input information (e.g., input bits) provided to encoder 445. The three (BL0, BL1, and BL2) at output nodes 447, 448, and 449 can represent output information (e.g., output bits) provided (e.g., generated) by encoder 445.

The value (e.g., "010", "111", "100", "000", "001", "011", "101", or "110") of bits BL0, BL1, and BL2 represents the value of information stored in the selected memory cell pair. For example, if memory cell pair 410 of memory cell group $405_0$ is selected, then the of bits BL0, BL1, and BL2 would be "010", which is the value of information stored in memory cell pair 410 of memory cell group 4050. In another example, if memory cell pair 413 of memory cell group $405_0$ is selected, then the of bits BL0, BL1, and BL2 would be "000", which is the value of information stored in memory cell pair 413 of memory cell group 4050. Logic operations performed by encoder 445 to generate bits BL0, BL1, and BL2 is described below.

FIG. 5 is a chart 545 showing eight logic states and corresponding binary values that can be stored in a memory cell of memory device 400 of FIG. 4, and encoding values of corresponding to the logic states, according to some embodiments described herein. Chart 545 shows nine logic states. The nine logic states of chart 545 can be created based on nine different combinations of three possible logic states obtaining from connections of one memory cell (of a memory cell pair) with two data line of a data line set (four data lines) and another three possible logic states obtaining from connections of the other memory cell (of the memory cell pair) with two data line of a data line set (four data lines). As described above, at most one electrical connection (or no electrical connection) can be formed between one memory cell of a memory cell pair and associated two data lines. Thus, two memory cells (of a memory cell pair) and four data lines can provide nine possible logic states based on this connection arrangement. One of the nine logic states in chart 545 can be unused because only eight logic states are needed to for encoding the eight logic states to the values of three bits BL0, BL1, and BL2.

In FIG. 5, each of the eight logic states (first to eighth) can be assigned to one of eight values "000", "001", "010", "011", "100", "101", "110", and "111" of three bits that can be stored in a memory cell pair (one of memory cell pair 410-417 in FIG. 4) of memory device 400.

Bits LBL0, LBL1, LBL2, and LBL3 in chart 545 can represent the four bits of one of data line set $406_0$ through $406_m$ of memory device 400 in FIG. 4. Thus, bits LBL0, LBL1, LBL2, and LBL3 can represent bits $LBL0_0$, $LBL1_0$, $LBL2_0$, and $LBL3_0$, respectively, and represent bits $LBL0_m$, $LBL1_m$, $LBL2_m$, and $LBL3_m$, respectively.

As shown in FIG. 5, bits LBL0, LBL1, LBL2, and LBL3 can have different values (e.g., different combinations of "0" and "1") based on the value (e.g., "000", "001", "010", "011", "100", "101", "110", or "111") of information stored in a memory cell pair (any of memory cell pairs 410-417) of memory device 400. For example, as shown in FIG. 5, bits LBL3, LBL2, LBL1, and LBL0 can have values "0", "1", "1", and "1", respectively, if the value stored in a memory cell pair of memory device 400 is "101". In another example, bits LBL3, LBL2, LBL1, and LBL0 can have values "1", "1", "0", and "1," respectively, if the value stored in a memory cell pair of memory device 400 is "001".

Chart 545 also shows the values for bits BL0, BL1, and BL2 (e.g., output information) that can be obtained based on logic operations performed by encoder 445 on bits LBL0, LBL1, LBL2, and LBL3 (e.g., input information). As shown in FIG. 5, the value of bit BL0 can be based on NAND<LBL3, LBL1>, which is logic operation NAND on bits LBL3 and LBL1. The value of bit BL1 can be based on XOR<LBL2, LBL0>, which is logic operation XOR (exclusive OR) on bits LBL2 and LBL0. The value of bit BL2 can be based on NAND<LBL3, LBL0>, which is logic operation NAND on bits LBL3 and LBL0. As shown in chart 545, the logic operations (logic operations NAND<LBL3, LBL1>, XOR<LBL2, LBL0, and NAND<LBL3, LBL0> performed by encoder 445) on bits LBL0, LBL1, LBL2, and LBL3 can provide all possible eight values ("000", "001", "010", "011", "100", "101", "110", and "111") in the form of the values of bits BL0, BL0, and BL2. Thus, the logic operations performed on bits LBL0, LBL1, LBL2, and LBL3 can determine which value (e.g., "000", "001", "010", "011", "100", "101", "110", or "111") was stored in a particular memory cell pair of memory device 400.

The combinations of values "0" and "1" (e.g., encoding values) associated with bits LBL0, LBL1, LBL2, and LBL3 can also be used to program a particular memory cell pair. As described above, programming (e.g., storing information in) a particular memory cell pair can include forming at most one electrical connection (or no electrical connection) between one memory cell of a memory cell pair and associated two data lines, and forming at most one electrical connection (or no electrical connection) between the other memory cell of the particular memory cell pair and associated two other data lines. In chart 545 of FIG. 5, for a given state, value "0" associated with a particular bit among bits LBL0, LBL1, LBL2, and LBL3 can indicate forming an electrical connection between a particular memory cell and the data line associate with that particular bit. For a given state, value "1" associated with a particular bit among bits LBL0, LBL1, LBL2, and LBL3 can indicate forming no electrical connection between a particular memory cell and the data line associate with that particular bit.

In FIG. 5, the presence or absence of an electrical connection between a particular memory cell pair (one of memory cell pairs 410-417) and a corresponding data line set is based values "0" and "1" associated with LBL0, LBL1, LBL2, and LBL3 of chart 545. For example, in FIG. 4, since memory cell 411 of memory cell group $405_0$ stores information having a value of "111", forming or not forming an electrical connection between memory cell pair 411 and data line set $406_0$ is based on the value of "111" (corresponding to logic state 6) of bits LBL0, LBL1, LBL2, and LBL3. Thus, programming memory cell pair 411 (to store value "111") can include (as shown in FIG. 4) forming an electrical connection 450 between memory cell 411A and data line $420_0$ (because LBL0="0" for logic state corresponding to "111" in chart 435), forming no electrical connection (e.g., no connection 459 in FIG. 4) between memory cell 411A and data line $421_0$ (because LBL1="1" for logic state corresponding to "111" in chart 435), forming no electrical connection (e.g., no connection 459 in FIG. 4) between memory cell 411B and data line $422_0$ (because LBL2="1" for logic state corresponding to "01" in chart 435), and forming an electrical connection 453 between memory cell 411B and data line $423_0$ (because LBL0="0" for logic state corresponding to "111" in chart 435).

Similarly, other memory cell pairs 410-417 of memory device 400 can include no electrical connections and electrical connections with respective data line sets $406_0$ through $406_m$ based on the values of bits LBL0, LBL1, LBL2, and LBL3 of chart 545.

Memory device 400 can have similar improvements and benefits like memory device 200. For example, memory device 400 can use one voltage (e.g., a single reference point) during a read operation (as described above) to determine the value (e.g., "000", "001", "010", "011", "100", "101", "110", and "111") of information stored (e.g., previously stored) in a selected memory cell (or memory cells). This can allow memory device 200 to avoid threshold voltage tuning for different values of information and avoid complex sensing circuitry. Other improvements and benefits of memory device 400 include its relatively smaller device area for a given storage density.

Figure 6:
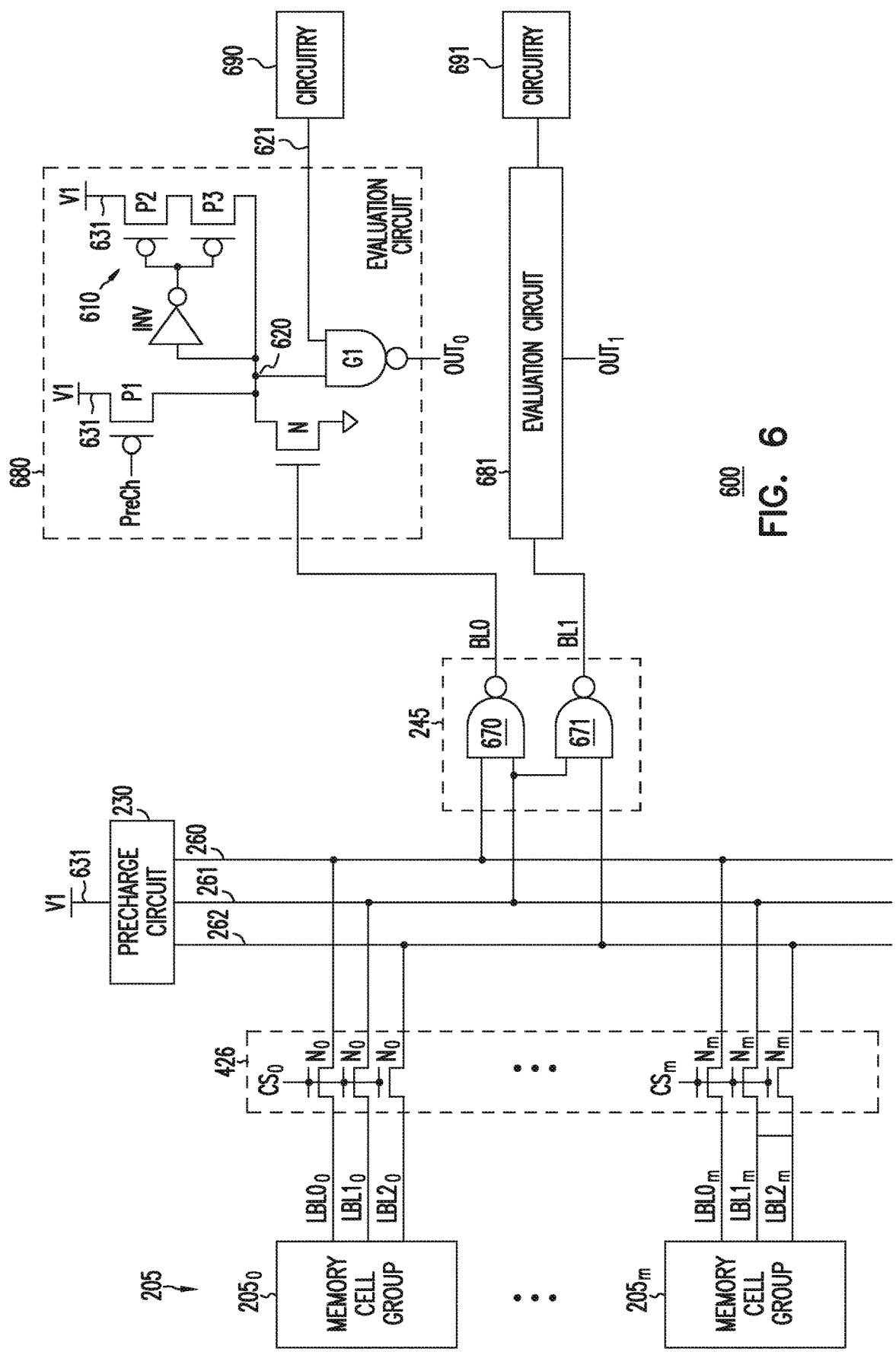
FIG. 6 shows a schematic diagram of a memory device including a two-bit output encoder and evaluation circuits, according to some embodiments described herein.

FIG. 6 shows a schematic diagram of a memory device 600 including a two-bit output encoder and evaluation circuits 680 and 681 to provide two bits of information, according to some embodiments described herein. Part of memory device 600 can be similar or the same as part of memory device 200 of FIG. 2. Thus, for simplicity, similar or the same elements between memory devices 200 and 600 are given the same labels and their descriptions are not repeated. For example, memory device 600 of FIG. 6 can include memory array 205 having memory cell groups $205_0$ through $205_m$, a data line set that can carry bits $LBL0_0$, $LBL1_0$, and $LBL2_0$, a data line set that can carry bits $LBL0_m$, $LBL1_m$, and $LBL2_m$, gating circuit 226 including transistors $N_0$ controlled by signal $CS_0$ and transistors $N_m$ controlled by a signal $CS_m$, precharge circuit 230 coupled to voltage V1 (e.g., Vcc) at a supply node 631, conductive lines 260, 261, and 262, and encoder 245.

As shown in FIG. 6, encoder 245 can include logic circuitry that includes logic gates (e.g., NAND gates) 670 and 671. Logic gate 670 can perform a logic operation (e.g., NAND operation) on bits LBL1 and LBL0 to provide bit BL0, such that BL0=NAND<LBL1, LBL0>. Logic gate 671 can perform a logic operation (e.g., NAND operation) on bits LBL2 and LBL1 to provide bit BL1, such that BL1=NAND<LBL2, LBL1>. Thus, values of bits BL0 and BL1 are BL0=NAND<LBL1, LBL0> and BL1=NAND<LBL2, LBL1> (which are also shown in chart 345 of FIG. 3).

In FIG. 6, evaluation circuit 680 can operate to generate information (e.g., bit) $OUT_0$ based on the value of bit BL0. Evaluation circuit 680 can include a pull-down component (e.g., transistor) N, a pull-up component (e.g., transistor) P1, a logic gate (e.g., logic NAND gate) G1, and a keeper 610 that can include transistors P2 and P3 and an inverter INV. Transistors P1 and P2 can be coupled in series (e.g., arranged in a stack (e.g., stacked transistors)) between a node 620 and supply node 631.

Pull-up component P1 can include a PMOS transistor that can be controlled (e.g., turned on or turned off) by a signal (e.g., precharge signal) PreCh. During a read operation, pull-up component P1 can respond to signal PreCh and turn on in order to form a circuit path between node 620 and supply node 631 to charge (e.g., precharge) node 620 to a voltage (e.g., voltage V1). Then pull-up component P1 turn can be turned off (to decouple node 620 from supply node 631) after the voltage at node 620 reaches a certain value (e.g., the value of voltage V1).

During a read operation, keeper 610 can operate to keep (e.g., or to cause) the value of voltage at node 620 to be based on the value of bit BL0. Logic gate G1 can operate to generate information $OUT_0$ at its output based on the voltages at nodes 620 and 621. The value of information $OUT_0$ can be based on the value of bit BL0 (e.g., $OUT_0$=BL0).

Memory device 600 may include a memory portion (e.g., circuitry) 690 coupled to node 621. During a read operation to read information from a selected memory cell of memory array 205, node 621 can be provided with a voltage, such that the value of information $OUT_0$ may be based on only the value of the voltage at node 620. For example, during a read operation to read information from a selected memory cell of memory array 205, node 621 can be provided with a voltage having a value (e.g., "1") independent of (e.g., regardless of) the value of bit BL0. In this example, memory portion 690 may operate to form a circuit path between node 621 and node 631, such that the voltage at node 621 can have a value based on the value of voltage V1 at node 631. In some arrangements, memory portion 690 can include a portion of memory device 600 that is similar to the portion of memory device 600 shown in FIG. 6, such that node 621 can be similar to node 620. In such arrangements, memory portion 690 can include a "mirror" of the portion of memory device 600 shown in FIG. 6. For example, except for logic gate G1, memory portion 690 can include a structure (e.g., mirrored copy) of the portion of memory device 600 shown in FIG. 6.

As shown in FIG. 6, memory device 600 can include an evaluation circuit 681 and circuitry 691. The structure and operation of evaluation circuit 681 and circuitry 691 can be similar to the structure and operation of evaluation circuit 680 and circuitry 690, respectively. Evaluation circuit 681 can generate information (e.g., bit) $OUT_1$. The value of information $OUT_1$ can be based on the value of bit BL1 (e.g., $OUT_1$=BL1).

Thus, as described above, the values of information (e.g., bits) $OUT_0$ and $OUT_1$ can be based on the values of bits BL0 and BL1, respectively. Since the values of the combination of bits BL0 and BL1 can be based on the value (e.g., one of "00", "01", "10", or "11") of information stored in a memory cell of memory array 205, the value of the combination of information $OUT_0$ and $OUT_1$ can represent the value (e.g., one of "00", "01", "10", or "11") of information stored in a memory cell of memory array 205.

Memory device 600 can include additional circuitry (not shown) to receive information $OUT_0$ and $OUT_1$. Such circuitry can include sense amplifiers and output circuits that can further process information $OUT_0$ and $OUT_1$ to generate information (e.g., output data) similar to information $D_{OUT}$ through $D_{OUTN}$ of memory device 100 of FIG. 1.

Figure 7:
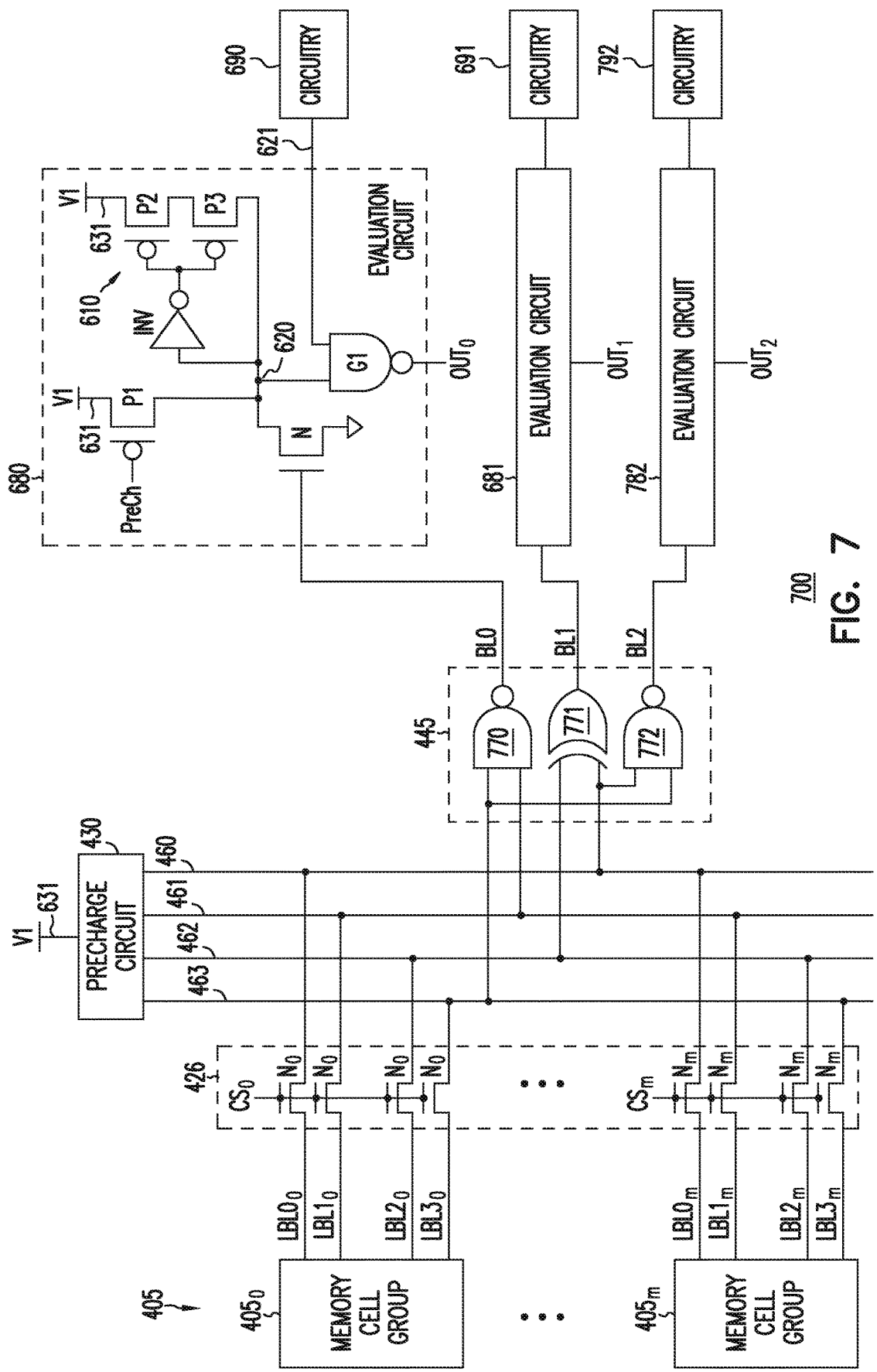
FIG. 7 shows a schematic diagram of a memory device including a three-bit output encoder and evaluation circuits, according to some embodiments described herein.

FIG. 7 shows a schematic diagram of a memory device 700 including a two-bit output encoder and evaluation circuits 780 and 781 to provide two bits of information, according to some embodiments described herein. Part of memory device 700 can be similar or the same as part of memory device 400 (FIG. 4) and memory device 600 (FIG. 6). Thus, for simplicity, similar or the same elements between memory devices 400, 600, and 700 are given the same labels and their descriptions are not repeated. For example, memory device 700 of FIG. 7 can include memory array 405 having memory cell groups $405_0$ through $405_m$, a data line set that can carry bits $LBL0_0$, $LBL1_0$, $LBL2_0$, and $LBL3_0$, a data line set that can carry bits $LBL0_m$, $LBL1_m$, $LBL2_m$, and $LBL3_m$, gating circuit 426 including transistors $N_0$ controlled by signal $CS_0$ and transistors $N_m$ controlled by a signal $CS_m$, precharge circuit 430 coupled to voltage V1 (e.g., Vcc), conductive lines 460, 461, 462, and 463, and encoder 445.

As shown in FIG. 7, encoder 445 can include logic circuitry that includes a logic gate (e.g., NAND gate) 770, a logic gate (e.g., XOR gate) 771, and a logic gate (e.g., NAND gate) 772. Logic gate 770 can perform a logic operation (e.g., NAND operation) on bits LBL3 and LBL1 to provide bit BL0, such that BL0=NAND<LBL3, LBL1>. Logic gate 771 can perform a logic operation (e.g., XOR operation) on bits LBL2 and LBL0 to provide bit BL1, such that BL1=XOR<LBL2, LBL0>. Logic gate 772 can perform a logic operation (e.g., NAND operation) on bits LBL3 and LBL0 to provide bit BL2, such that BL2=NAND<LBL3, LBL0>. Thus, values of bits BL0, BL1, and BL2 are BL0=NAND<LBL3, LBL1>, BL1=XOR<LBL2, LBL0>, and BL2=NAND<LBL3, LBL0>(which are also shown in chart 545 of FIG. 5).

In FIG. 7, of memory device 700 can include evaluation circuit 782 and memory portion (e.g., circuitry) 792. The structure and operation of evaluation circuit 782 and circuitry 792 can be similar to the structure and operation of evaluation circuit 680 and circuitry 690, respectively. Evaluation circuit 782 can generate information (e.g., bit) $OUT_2$. The value of information $OUT_2$ can be based on the value of bit BL1 (e.g., $OUT_2$=BL2).

Thus, as described above, the values of information (e.g., bits) $OUT_0$, $OUT_1$, and $OUT_2$ can be based on the values of bits BL0, BL1, and BL2, respectively. Since the values of the combination of bits BL0, BL1, and BL2 can be based on the value (e.g., one of "000", "001", "010", "011", "100", "101", "110", and "111") of information stored in a memory cell pair (two memory cells) of memory array 405, the value of combination of information $OUT_0$, $OUT_1$, and $OUT_2$ (e.g., one of "000", "001", "010", "011", "100", "101", "110", and "111") can represent the value of information stored in a memory cell pair of memory array 405.

Memory device 700 can include additional circuitry (not shown) to receive information $OUT_0$, $OUT_1$, and $OUT_2$. Such circuitry can include sense amplifiers and output circuits that can further process information $OUT_0$, $OUT_1$, and $OUT_2$ to generate information (e.g., output data) similar to information $D_{OUT}$ through $D_{OUTN}$ of memory device 100 of FIG. 1.

Figure 8:
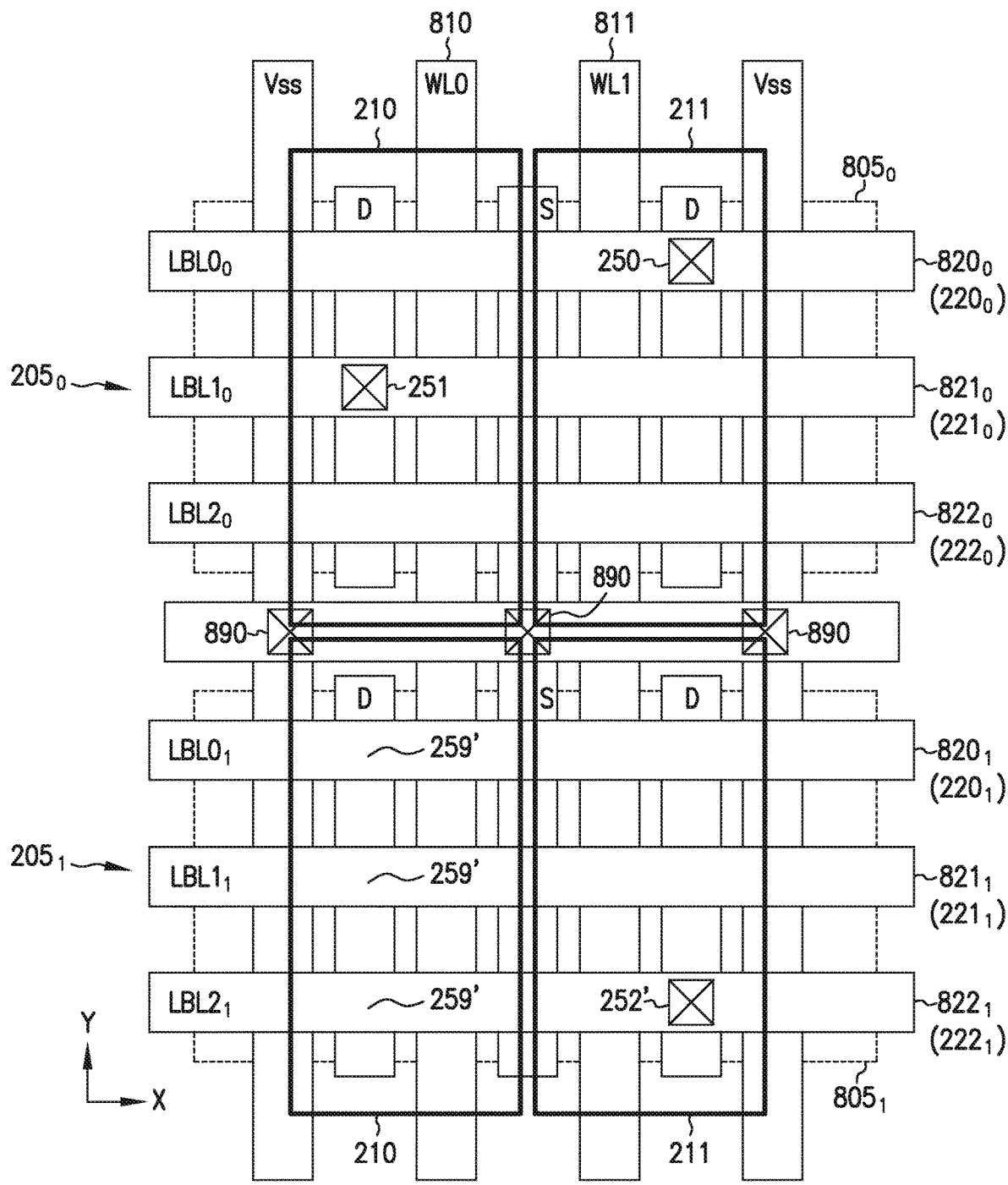
FIG. 8 shows a structure (e.g., layout) of a memory device, according to some embodiments described herein.

FIG. 8 shows a structure (e.g., layout) of a portion of memory device 200 of FIG. 2, according to some embodiments described herein. In FIG. 2 and FIG. 8, the same elements are given the same labels. For simplicity, FIG. 8 shows only a portion of memory device 200 that includes part of memory cell group $205_0$ including its memory cells 210 and 211 of memory cell group $205_0$, part of memory cell group $205_1$ including memory cell 210 and 211 of memory cell group $205_1$, part of data lines $220_0$, $221_0$, and $222_0$ (and associated bits $LBL1_0$, and $LBL2_0$), data lines $220_1$, $221_1$, and $222_1$ (and associated bits $LBL0_1$, $LBL1_1$, and $LBL2_1$), part of access lines (e.g., word lines) 810 and 811 (and associated signals WL0 and WL1), and part of ground conductive lines (associated with voltage Vss).

FIG. 8 also shows the locations of memory cells 210 and 211 in each of memory cell groups $205_0$ and memory cell group $205_1$. The location of each of memory cell groups $205_0$ and $205_1$ can be defined (e.g., can be located within) a cell boundary (e.g., a footprint of a single memory cell of memory device 200). In FIG. 8, the cell boundary is indicated by a darker square. FIG. 8 shows four cell boundaries corresponding for four memory cells (two memory cells 210 and two memory cells 211). FIG. 8 shows the cell boundaries being separated from each other only for illustrating purposes. However, the cell boundaries are touching each other (e.g., two adjacent memory cells can share a boundary line).

FIG. 8 also shows diffusion regions (e.g., diffusion grids) $805_0$ and $805_1$ in memory cell groups $205_0$ and $205_1$. D Diffusion region $805_0$ can be a region in memory device 200 where the source (labeled as "S") and the drain region (labeled as "D") of a transistors of a respective memory cell (e.g., memory cell 210 or 211) of memory cell group $205_0$ are formed. Diffusion region $805_1$ can be a region in memory device 200 where the source (labeled as "S") and the drain region (labeled as "D") of a transistors of a respective memory cell (e.g., memory cell 210 or 211) of memory cell group $205_1$ are formed.

As shown in FIG. 8, each of access lines 810 and 811 can have length in the Y-direction, which is perpendicular to the X-direction. Each of access lines 810 and 811 can be formed from a conductive material (e.g., polysilicon, metal, or other conductive materials).

FIG. 8 shows conductive lines (e.g., metal lines) $820_0$, $821_0$, and $822_0$ that can be part of respective data lines $220_0$, $221_0$, and $222_0$. Thus, conductive lines $820_0$, $821_0$, and $822_0$ are conductive regions that are electrically separated from each other. Each of conductive lines $820_0$, $821_0$, and $822_0$ can have a length in the X-direction. Each of conductive lines $820_0$, $821_0$, and $822_0$ can be formed from a conductive material (e.g., polysilicon, metal, or other conductive materials). Conductive lines $820_0$, $821_0$, and $822_0$ can be formed over (e.g., formed on top of) at least part of the memory cells (e.g., formed over the drain region D of each of the transistor) of memory cell group $205_0$. As shown in FIG. 8, conductive lines $820_0$, $821_0$, and $822_0$ can span across the cell boundary of each of memory cells 210 and 211 of memory cell group $205_0$.

Similarly, FIG. 8 shows conductive lines (e.g., metal lines) $820_1$, $821_1$, and $822_1$ that can be part of respective data lines $220_1$, $221_1$, and $222_1$. Thus, conductive lines $820_1$, $821_1$, and $822_1$ are conductive regions that are electrically separated from each other. Each of conductive lines $820_1$, $821_1$, and $822_1$ can have a length in the X-direction. Conductive lines $820_1$, $821_1$, and $822_1$ can be formed over (e.g., formed on top of) the memory cells (e.g., over the source region S and the drain region D) of memory cell group $205_1$. As shown in FIG. 8, conductive lines $820_1$, $821_1$, and $822_1$ can span across the cell boundary of each of memory cells 210 and 211 of memory cell group $205_1$.

As shown in FIG. 8, the source region S of each of the transistor can be coupled to the ground conductive line through one of conductive contacts 890, which can correspond to node (e.g., ground node) 290 of FIG. 2.

In FIG. 8, connections (electrical connections) 251, 250, and 252' correspond to the same connections that are schematically shown in FIG. 2. In FIG. 8, each of the connections 251, 250, and 252' can include a conductive material (conductive contact) that can be formed in a via connecting a conductive line to the drain region D of the transistor of a respective memory cell. For example, FIG. 8 shows connection 251 between conductive line $821_0$ and the drain region D of the transistor of memory cell 210 of memory cell group $205_0$. FIG. 8 shows no connection between the drain region of D of the transistor of memory cell 210 of memory cell group $205_0$ and each of conductive lines $820_0$ and $822_0$ to indicate that only one (at most one) of conductive lines $820_0$, $821_0$, and $822_0$ can be electrically coupled to the drain region of D of the transistor of memory cell 210 of memory cell group $205_0$.

In another example, FIG. 8 shows connection 250 between conductive line $820_0$ and the drain region D of the transistor of memory cell 211 of memory cell group $205_0$. FIG. 8 shows no connection between the drain region of D of the transistor of memory cell 211 of memory cell group $205_0$ and each of conductive lines $821_0$ and $822_0$ to indicate that only one (at most one) of conductive lines $820_0$, $821_0$, and $822_0$ can be electrically coupled to the drain region of D of the transistor of memory cell 211 of memory cell group $205_0$.

In another example, FIG. 8 shows connection 252' between conductive line $822_1$ and the drain region D of the transistor of memory cell 211 of memory cell group $205_1$. FIG. 8 shows no connection between the drain region of D of the transistor of memory cell 211 of memory cell group $205_1$ and each of conductive lines $821_1$ and $822_1$ to indicate that only one (at most one) of conductive lines $820_1$, $821_1$, and $822_1$ can be electrically coupled to the drain region of D of the transistor of memory cell 211 of memory cell group $205_1$.

In another example, FIG. 8 shows no connection 259' between the drain region D of memory cell 210 of memory cell group $205_1$ and any of conductive lines $820_1$, $821_1$, and $822_1$.

The above description with respect to FIG. 8 describes a portion of the structure of memory device 200. Other portions (e.g., other memory cells and electrical connections not shown in FIG. 8) of memory device 200 can have similar structures as the structures shown in FIG. 8.

In comparison with some non-volatile memory devices (memory devices that store one bit per cell), memory device 200 can have a relatively greater cell boundary with respect to cell poly pitch (PP). However, the overall area of memory device 200 for a given storage density can be effectively smaller than the area of some conventional non-volatile memory devices because of each of the memory cells of memory device 200 can store more information (e.g., store more than one bit of information) in each memory cell than a memory cell of some conventional non-volatile memory devices can store (e.g., store at most one bit).

Figure 9:
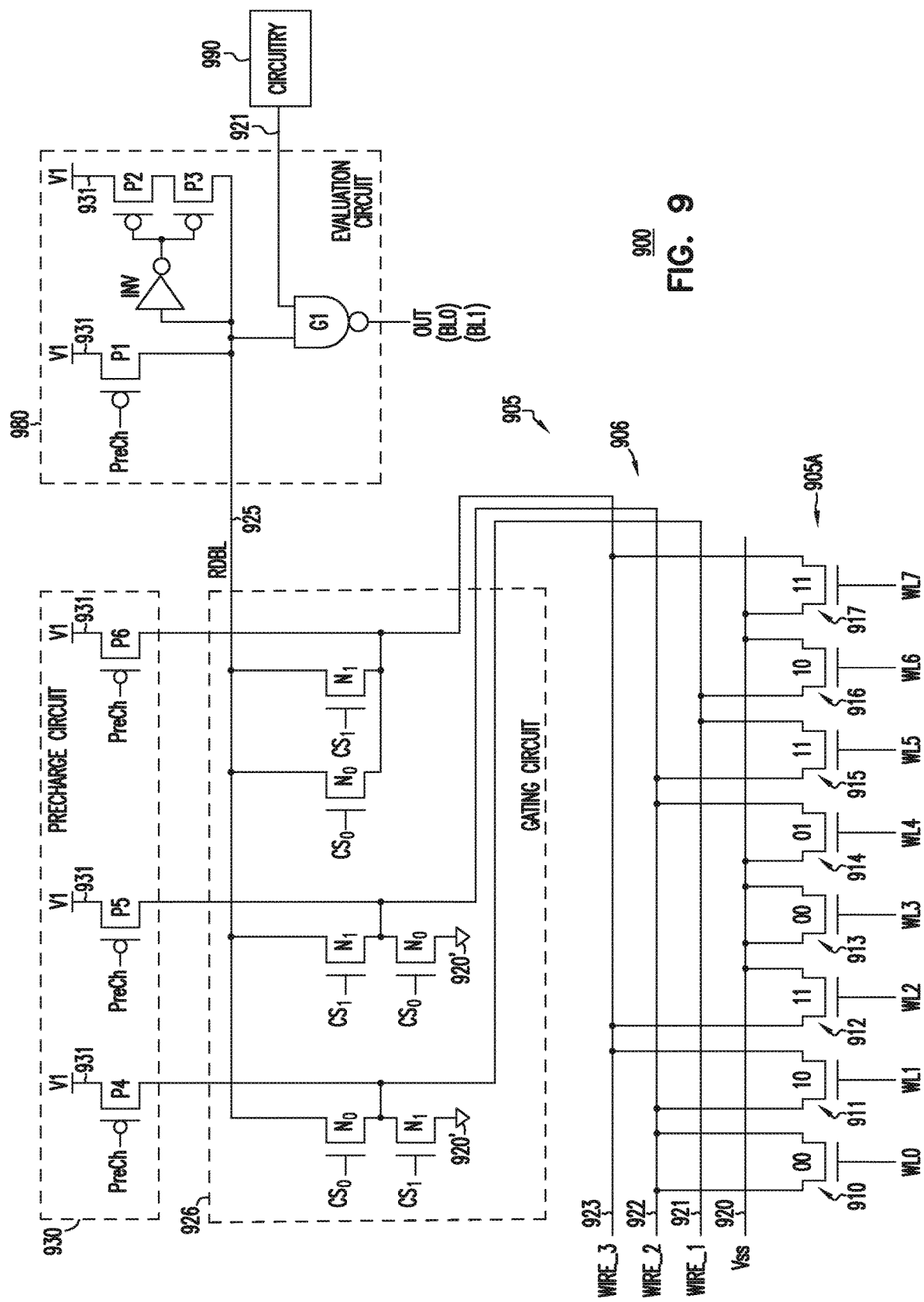
FIG. 9 shows a schematic diagram of a memory device including non-volatile memory cells where each memory cell can be configured support four logic states to store two bits of information in each memory cell and a gating circuit to enable sequential reading the two bits stored in each of the memory cells, according to some embodiments described herein.

FIG. 9 shows a schematic diagram of a memory device 900 including non-volatile memory cells 910-917 where each memory cell can be configured support four logic states to store two bits of information in each memory cell and a gating circuit 926 to enable reading the two bits stored in each of memory cells 910-917, according to some embodiments described herein. Memory device 900 can include a memory array 905 having memory cells 910-917 that can form a memory cell group (e.g., memory cell column) 905A of memory device 900. FIG. 9 shows memory cell group 905A having eight memory cells 910-217 as an example. However, the number of memory cells in memory cell group 901A can be different from eight. For simplicity, only one memory cell group (e.g., memory cell group 905A) of memory device 900 is shown in FIG. 9. Memory device 900 can include other memory cell groups (not shown) similar to memory cell group 905A.

Each of memory cells 910-917 of memory device 900 can include a transistor. FIG. 9 shows an example of n-channel metal-oxide semiconductor (NMOS) transistor for each of memory cells 910-917 of memory device 900. The transistor of each of the memory cells of memory device 900 can include Fin Field-effect transistor (FinFET) structure or other transistor structures. FIG. 9 shows each of memory cells 910-917 includes an NMOS transistor as an example. Other types of transistors can be used. For example, each of memory cells 910-917 in an alternative structure of memory device 900 can include a PMOS transistor. In the alternative structure, the type (e.g., transistor type) of devices in peripheral circuits (e.g., at least one of gating circuit 926, precharge circuit 930, and evaluation circuit 980) can be exchanged from one type to another (e.g., from n-type to p-type and from p-type to n-type).

Each of memory cells 910-917 of memory device 900 can be configured to support four logic states that can correspond to four possible values (e.g., "00", "01", "10", and "11") of a combination of two binary values (e.g., the values of two bits). Thus, each of memory cells 910-917 can store two bits (e.g., BL0 and BL1) of information. The value of information stored in each of memory cells 910-917 can be any value among the four possible values (e.g., "00", "01", "10", and "11") of two bits.

FIG. 9 shows example values of information stored (e.g., permanently stored) in memory cells 910-917 of memory device 900. As shown in FIG. 9, the values of two bits of information stored in memory cells 910-917 do not follow a particular pattern. The stored values of the two bits in each of memory cells 910-927 are based on predetermined values (e.g., user-defined values) to be stored in memory cells 910-917. For example, the values of information (e.g., two bits BL0 and BL1) stored in respective memory cells 910-917 are (from left to right) "00", "10", "11", "00", "01", "11", "10", and "11", respectively. In FIG. 9, the values of the two bits stored in each of memory cells 910-917 can correspond to the values of bits BL0 and BL1, respectively. For example, the values of bits BL0 and BL1 stored in memory cell 911 are BL0="1" and BL1="0". In another example, the values of bits BL0 and BL1 stored in memory cell 914 are BL0="0" and BL1="1".

As shown in FIG. 9, memory device 900 can include access lines (e.g., word lines) and associated signals (e.g., word line signals) WL0 through WL7; conductive lines 920, 921, 922, and 923 (920-923) that can form a data line set (e.g., a local data line set) 906 and a conductive line (e.g., local data line (e.g., local bit line)) 925; gating circuit 926 that includes transistors N0 and N1; a precharge circuit 930 that includes transistors P4, P5, and P6; an evaluation circuit 980 that includes transistors P1, P2, and P3, and inverter INV; a NAND gate G; and circuitry 990 (which is included in a memory portion of memory device 900). FIG. 9 shows precharge circuit 930 an evaluation circuit 980 being separate circuits as an example. However, precharge circuit 930 and evaluation circuit 980 can be part of the same circuit.

During a read operation, memory device 900 can selectively activate (e.g., activate one at a time) signals WL0 through WL7 to select one of memory cell among memory cells 910-917 to be a selected memory cell to read information from the selected memory cell. For example, if memory cell 910 to be selected during a read operation, memory device 900 can activate signal WL0 (and deactivate signals WL1 through WL7 while signal WL0 is activated) to select memory cell 910 to read information from it.

Conductive lines 920-924 are formed to allow each of memory cells 910-9197 to support four logic states to store two bits of information in each memory cell. As shown in FIG. 9, conductive line 920 can have a voltage Vss (e.g., ground). Conductive lines 921, 922, and 923 can carry signals WIRE_1, WIRE_2, and WIRE_3, respectively. Data line 921 (associated with signal WIRE_1) can be coupled to a node 920' through one of transistors $N_1$. Data line 922 (associated with signal WIRE_2) can be coupled to a node 920' through one of transistors $N_2$. Node 920' can be ground (e.g., voltage Vss). Thus, node 920' can have the same voltage (e.g., voltage Vss) as conductive line 920. Conductive line 925 can carry a bit RDBL where the value (e.g., "0" or "1") of bit RDBL can be based on the value (e.g., voltage level) of the signal on conductive line 925.

During a read operation of memory device 900, the values of signals WIRE_1, WIRE_2, and WIRE_3 can be based on the value of information stored (e.g., previously stored) in a selected memory cell of memory cell group 905A. The value of bit RDBL on conductive line 925 during a read operation can be based on the connection between conductive line 925 and conductive lines 920-923.

Gating circuit 926 can operate to selectively couple conductive line 925 to different combinations of conductive lines 920-923 and node 920' during part of a read operation of reading of information stored in a selected memory cell (or memory cell) among memory cells 910-917. Gating circuit 926 can use signals (e.g., column select signals) $CS_0$ and $CS_1$ to control (e.g., turn on or turn off) transistors $N_0$ and $N_1$. Gating circuit 926 can activate signals $CS_0$ and $CS_1$ one at a time (e.g., sequentially activated). For example, when signal $CS_0$ is activated, signal $CS_1$ is deactivated, and when signal $CS_1$ is activated, signal $CS_0$ is deactivated.

Transistors $N_0$ can all be turned on when signal $CS_0$ is activated and all be turned off when signal $CS_0$ is deactivated. Transistors $N_1$ can all be turned on when signal $CS_1$ is activated and all be turned off when signal $CS_1$ is deactivated. Thus, transistors $N_0$ are turned off (or kept off) when transistors $N_1$ are turned on, and transistors $N_1$ are turned off (or kept off) when transistors $N_0$ are turned on.

The value of bit RDBL when signal $CS_0$ is activated (signal $CS_1$ is deactivated) during a read operation can represent one bit (e.g., bit BL0) of the two bits stored in a selected memory cell. The value of bit RDBL when signal $CS_1$ is activated (signal $CS_0$ is deactivated) during a read operation can represent the other bit (e.g., bit BL1) of the two bits stored in the selected memory cell. Thus, after the activations of signals $CS_0$ and $CS_1$ (which are activated one at a time) during a read operation, two bits (e.g., BL0 and BL1) can be provided (e.g., sequentially provided) from conductive line 925.

During a read operation, evaluation circuit 980, NAND gate G1, and circuitry 990 can operate to generate information OUT that has a value to reflect the value (e.g., the values of bits BL0 and BL1) of information stored in a selected memory cell among memory cells 910-917. The value of information OUT is based on the value of signal RDBL. For example, OUT="0" when RDBL="1", and OUT="1" when RDBL="0". Thus, during reading of information from a selected memory cell, evaluation circuit 980 can provide (e.g., sequentially provided) two bits (e.g., bits BL0 and BL1) presented by the values of information OUT.

In memory device 900, storing a value (one of four values "00", "01", "10", and "11") of information (two bits of information) in a particular memory cell among memory cell 910-917 can be performed (e.g., programmed) by forming an electrical connection (e.g., a fixed electrical connection) between the source (source region) of the transistor (e.g., NMOS transistor shown in FIG. 9) of that particular memory cell and one of conductive lines 920-923, and forming an electrical connection (e.g., a fixed electrical connection) between the drain (drain region) of the transistor (e.g., NMOS transistor shown in FIG. 9) of that particular memory cell and one of conductive lines 920-923. In this description, the drain and the source (non-gate regions of a transistor) of a transistor can be used interchangeably. For example, if a non-gate region (terminal) of the transistor is called the source then the other non-gate region of the transistor is called the drain, and vice versa.

In memory device 900, selecting which line (among conductive lines 920-923) to form an electrical connection (or not to form an electrical connection) with the drain or the source of the transistor of a particular memory cell is based on the value of information (e.g., "00", "01", "10", and "11") to be stored in that particular memory cell. The specific electrical connections between memory cells 910-917 shown on FIG. 9 are selected from the possible connection combinations shown in a chart of FIG. 10.

FIG. 10 is a chart 1045 showing values of two bits BL0 and BL1 that can be stored in a memory cell of memory device 900 and all possible connection combinations (e.g., different options) for forming a connection between each of the source and drain of the transistor (e.g., NMOS transistor) of the memory cell and conductive lines 920-923, according to some embodiments described herein. As shown in FIG. 10, there are four possible states (e.g., four combinations of two binary values) of bits BL0 and BL1: "11", "10", "01", and "00". Labels "transistor source" and "transistor drain" in FIG. 10 correspond to the source and drain of the transistor of a memory cell (e.g., any of memory cells 910-917) of memory device 900 of FIG. 9.

FIG. 10 shows signals Vss, WIRE_1, WIRE_2, and WIRE_3 below respective transistor source and transistor drain columns to indicate possible electrical connections that can be formed between each of the source and drain of the transistor of a memory cell and one of conductive lines 920-923 (FIG. 9) that carry respective signals Vss, WIRE_1, WIRE_2, and WIRE_3. The possible connections of chart 1045 in FIG. 10 are based on the state ("11", "10", "01", or "00") to be stored in a memory cell. As shown in FIG. 10, four signals Vss, WIRE_1, WIRE_2, and WIRE_3 (associated with conductive lines 920-923, respectively, in FIG. 9) can provide four possible connections (four possible ways) to store (e.g., program) each of the four logical states in a memory cell. Thus, there are four possible connections between the transistor of a memory cell and conductive lines 920-923 (FIG. 9) when "11" is to be stored in the memory cell, four possible connections between the transistor of the memory cell and conductive lines 920-923 when "10" is to be stored in the memory cell, four possible connections between the transistor of the memory cell and conductive lines 920-923 when "01" is to be stored in the memory cell, and four possible connections between the transistor of the memory cell and conductive lines 920-923 when "00" is to be stored in the memory cell. In addition to the four possible connections, there are two extra connections (the last two connection in chart 1045) for value "00" (such that there are six possible ways (possible connections) to store value "00" in a memory cell. In memory device 900, neighboring memory cells (e.g., two memory cells located immediately next to each other) among memory cells 910-917 can share a diffusion region (e.g., a source region or a drain region). However, each of the four logical states (e.g., "00", "01", "10", and "11") can be supported all connections of conductive lines 920-923 (to provide all four logical states) that are connected to memory cells 910-917.

As shown in the first row of chart 1045, to storing (e.g., to program) bit BL0 and BL1 having values of "11" in a particular memory cell, the source of the transistor of that particular memory cell can be connected to the conductive line that carries signal WIRE_3 (which is conductive line 923), and the drain of the transistor of that particular memory cell can be connected to the conductive line that carries signal Vss (which is conductive line 920). The particular memory cell in this example can be memory cell 912 in FIG. 9. As shown in FIG. 9, the source and drain of the transistor of memory cell 912 are connected to conductive lines 923 and 920, respectively, when memory cell 912 stores value "11".

Based one chart 1045 in FIG. 10, the source and drain of the transistor of memory cell 912 can alternatively be coupled to conductive lines 920-924 in any of the three other possible connections (row second to fourth in chart 1045) when value "11" is to be stored in memory cell 912. For example (based on the second row of chart 1045), the source and drain of the transistor of memory cell 912 can be connected to conductive lines 920 and 923, respectively (e.g., associated with signals Vss and WIRE_3) when value "11" is to be stored in memory cell 912. In another example (based on the third row of chart 1045), the source and drain of the transistor of memory cell 912 can be connected to conductive lines 921 and 922, respectively (e.g., associated with signals WIRE_1 and WIRE_2, or WIRE_2 and WIRE_1) when value "11" is to be stored in memory cell 912. In another example (based on the fourth row of chart 1045), the source and drain of the transistor of memory cell 912 can be connected to conductive lines 922 and 921, respectively (e.g., associated with signals WIRE_2 and WIRE_1) when value "11" is to be stored in memory cell 912.

Storing (e.g., programming) each of other values "10", "01", and "00" in a memory cell of memory device 900 can include forming connections between the transistor of the memory cell and conductive lines 920-923 based chart 1045 of FIG. 10.

Based on chart 1045, every pair of logic values for bits BL0 and BL1 can start with connecting the source or drain of the transistor of a memory cell of memory device 900 (FIG. 9) to conductive lines 920-923 (associated with signals Vss, WIRE_1, WIRE_2, and WIRE_3). Therefore, the transistors (e.g., the ROM array transistors) of a memory cell group (e.g., memory cell group 905A that includes memory cells 910-917) can abut directly next to their neighbors and share an overlapped transistor source or drain. The transistors of the memory cell group can be controlled (e.g., gated) by respective signals (e.g., signals WL0 through WL7) in an access line bus (e.g., a read word line bus signals WL0 through WL7) without requiring any breaks or separation (e.g., break in the source or drain) of neighbor transistors. Thus, based on chart 1045, programming a transistor of a memory cell can begin with a shared source or drain from a transistor (which has been programmed) of a neighbor memory cell, regardless of how the transistor of the neighbor memory cell was programmed. Based on chart 1045, the intermediate source or drain regions of the transistors of the multiple neighbor memory cells can be floating (e.g., left unconnected) in a situation where the multiple neighbor memory cells store the same value of "00". When such a situation happens, it provides an opportunity to choose which of conductive lines 920-923 to begin with after the floating source or drains. This may be helpful in selecting the number of components (e.g., pull-down transistors) connected between conductive line 925 and ground (e.g., node 920').

Based on the possible connections shown in chart 1045 in FIG. 10, different memory cells storing the same value (same value of two bits) can have different electrical connections with conductive lines 920-923. For example, as shown in FIG. 9, memory cells 910 and 913 store the same value of "00". However, memory cells 910 and 913 have different electrical connections with conductive lines 920-923. In this example, both the source and drain of the transistor of memory cell 910 are connected to conductive line 922 when information stored in memory cell 910 is "00". However, the source and drain of the transistor of memory cell 913 are connected to conductive line 920 when information stored in memory cell 913 is "00". In another example, memory cells 911 and 916 store the same value of "10". However, memory cells 911 and 916 have different electrical connections with conductive lines 920-923. In another example, memory cells 912 and 915 store the same value of "11". However, memory cells 912 and 915 have different electrical connections with conductive lines 920-923.

As mentioned above, gating circuit 926 can operate to selectively couple conductive line 925 to conductive lines 920-923 and node 920' during part of a read operation of reading of information stored in a selected memory cell (or memory cell) among memory cells 910-917. As shown in FIG. 9, each of transistors $N_0$ includes a gate (transistor gate). The gates of transistors $N_0$ are electrically separated from the gates of transistors $N_1$. The gates of transistors $N_0$ can receive (e.g., can be controlled by) the same signal (e.g., signal $CS_0$). Thus, the gates of transistors $N_0$ can be electrically coupled to each other. The gates of transistors $N_1$ can receive (e.g., can be controlled by) the same signal (e.g., signal $CS_1$). Thus, the gates of transistors $N_1$ can be electrically coupled to each other.

Gating circuit 926 can activate signal $CS_0$ to turn on transistors $N_0$ (or activate signal $CS_1$ to turn on transistors $N_1$) during a stage (e.g., an evaluation stage after a precharge stage) of a read operation to read one bit (among the two bits) of information from a selected memory cell of memory cells 910-917. A combination of conductive lines (e.g., conductive lines 921 and 923) of conductive lines 920-923 is coupled to conductive line 925 when transistors $N_0$ are turned on (while transistors $N_1$ are turned off). Another combination of conductive lines (e.g., conductive lines 922 and 923) of conductive lines 920-923 is coupled to conductive line 925 when transistors $N_1$ are turned on (while transistors $N_0$ are turned off). Based on the connection between conductive line 925 and selected memory cell (through transistors $N_0$ or transistors $N_1$ that are turned on), conductive line 925 can either remain at a precharge voltage level (e.g., 1.2V) or discharge to voltage Vss (e.g., 0V) through conductive line 920 or node 920'.

In FIG. 9, precharge circuit 930 can operate to charge (e.g., during a precharge stage of a read operation) conductive lines 921, 922, and 923 to a precharge voltage level (e.g., 1.2V), which can be equal to the voltage level of voltage V1 at node (e.g., supply node) 931. Voltage V1 can be a supply voltage (e.g., Vcc) of memory device 900. Evaluation circuit 980 can operate to charge (e.g., during a precharge stage of a read operation) conductive line 925 to a precharge voltage level, which can be the same as the precharge voltage level on conductive lines 921, 922, and 923.

During a stage (an evaluation stage after a precharge stage) of a read operation, conductive line 925 can either maintain (remain at) the precharge voltage level (e.g., 1.2V) or discharge (decrease) to Vss (e.g., ground) through conductive line 920 or node 920', depending on the value of the bit (among the two stored bits) of information being read from the selected memory cell. The voltage level (e.g., either precharge voltage level or ground) on conductive line 925 can represent the value (binary value "0" or "1") of bit RDBL.

Evaluation circuit 980, NAND gate G1, and memory portion (circuitry) 990 can operate to generate information OUT based on bit RDBL. Information OUT has a value to reflect the value (e.g., the values of bits BL0 and BL1) of information stored in a selected memory cell among memory cells 910-917. During a read operation to read information from a selected memory cell among of memory array 905, node 921 can be provided with a voltage, such that the value of information OUT may be based on only the value of the voltage on conductive line 925. For example, during a read operation to read information from a selected memory cell of memory array 905, node 921 can be provided with a voltage having a value (e.g., "1") independent of (e.g., regardless of) the value of bit RDBL. In this example, memory portion 990 may operate to form a circuit path between node 921 and node 931, such that the voltage at node 921 can have a value based on the value of voltage V1 at node 931. In some arrangements, memory portion 990 can include a portion of memory device 900 that is similar to the portion of memory device 900 shown in FIG. 9, such that node 92a1 can be similar to node on conductive line 925. In such arrangements, memory portion 990 can include a "mirror" of the portion of memory device 900 shown in FIG. 9. For example, except for logic gate G1, memory portion 990 can include a structure (e.g., mirrored copy) of the portion of memory device 900 shown in FIG. 9.

Thus, as described above, the value of information (e.g., bit) OUT can be based on the values of bit RDBL. Since the values of bit RDBL can be based on the value (e.g., one of "0" or "1") of each of the two bits of information stored in a memory cell of memory array 905, the value of information OUT can represent the value of information stored in a memory cell of memory array 905.

Memory device 900 can include additional circuitry (not shown) to receive information OUT. Such circuitry can include sense amplifiers and output circuits that can further process information OUT to generate information (e.g., output data) similar to information $D_{OUT}$ through $D_{OUTN}$ of memory device 100 of FIG. 1.

Figure 11:
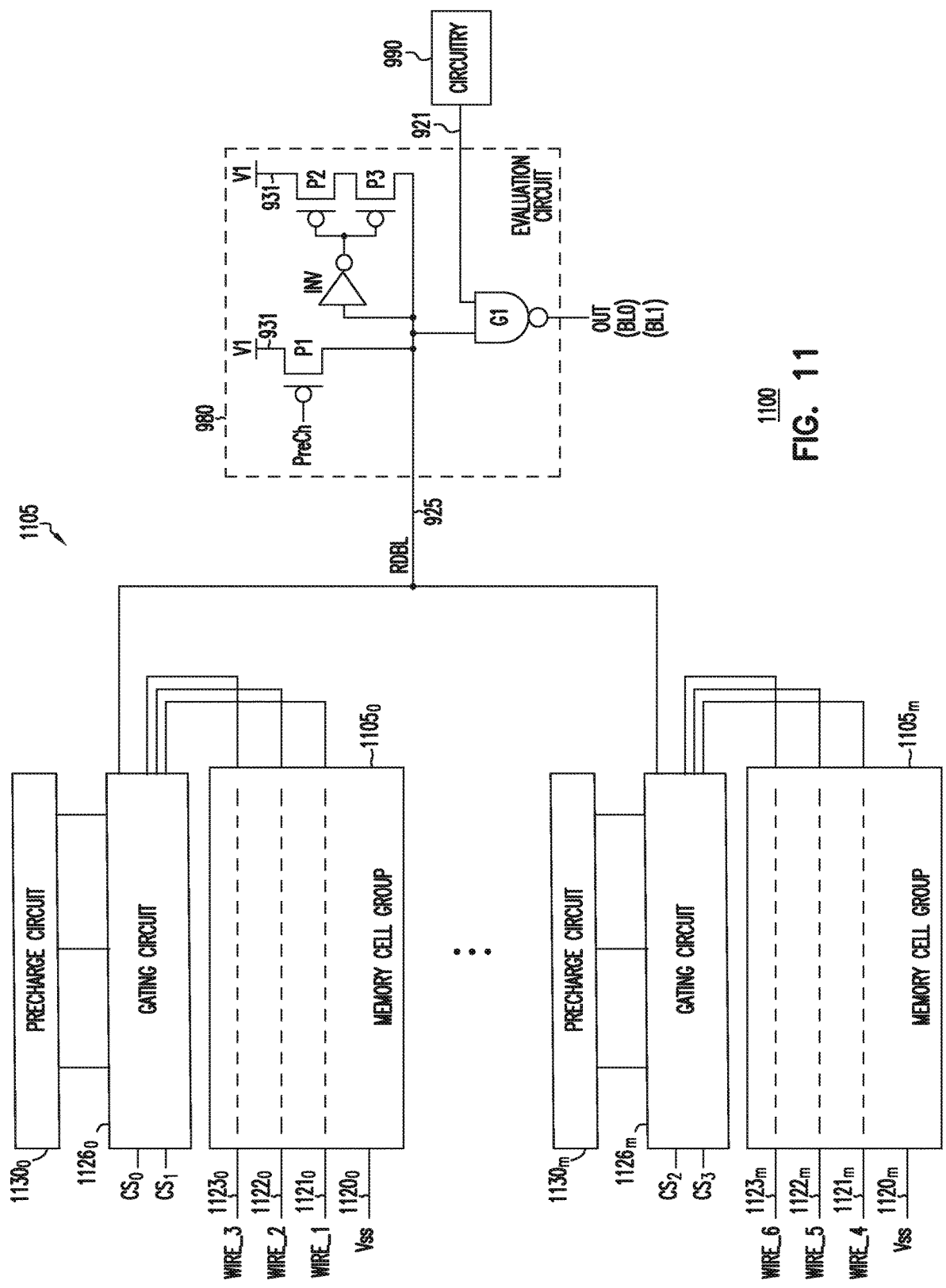
FIG. 11 shows a memory device having memory cell groups that share an evaluation circuit, according to some embodiments described herein.

FIG. 11 shows a memory device 1100 having memory cell groups $1105_0$ through $1105_m$ that share an evaluation circuit 980, according to some embodiments described herein. Part of memory device 1100 can be similar or the same as part of memory device 900 of FIG. 9. Thus, for simplicity, similar or the same elements (evaluation circuit 980, gate G1, and memory portion (e.g., circuitry) 990) between memory devices 900 and 1100 are given the same labels and their descriptions are not repeated.

As shown in FIG. 11, memory device 1100 can include a memory array 1105 having memory cell groups $1105_0$ through $1105_m$, conductive lines $1120_0$, $1121_0$, $1122_0$, and $1123_0$ ($1122_0$-$1123_0$) that can carry respective signals Vss, WIRE_1, WIRE_2, and WIRE_3, conductive lines $1120_m$, $1121_m$, $1122_m$, and $1123_m$ ($1122_m$-$1123_m$) that that can carry respective signals Vss, WIRE_4, WIRE_5, and WIRE_6. FIG. 11 shows two memory cells memory cell groups $1105_0$ through $1105_m$ of memory array 1105 for simplicity. The number of memory cell groups of memory array 1105 can be greater and two. Each of memory cell groups $1105_0$ through $1105_m$ can have memory cells similar to memory cells 910-917 memory device 900 of FIG. 9. Thus, each memory cell in memory cell groups $1105_0$ through $1105_m$ can store two bits of information.

Memory cell groups $1105_0$ and signals Vss, WIRE_1, WIRE_2, and WIRE_3 can be similar to memory cell groups 905A and signals Vss, WIRE_1, WIRE_2, and WIRE_3, respectively, of FIG. 9. Memory cell groups $1105_m$ and signals Vss, WIRE_4, WIRE_5, and WIRE_6 can also be similar to memory cell groups 905A and signals Vss, WIRE_1, WIRE_2, and WIRE_3, respectively, of FIG. 9.

Memory device 1100 can include precharge circuits $1130_0$ through $1130_m$. Precharge circuit $1130_0$ can include circuit elements (e.g., transistors P4, P5, and P6) and operate in ways similar to precharge circuit 930 of FIG. 9. For example, precharge circuit $1130_0$ can charge (e.g., precharge) conductive lines $1122_0$-$1123_0$ to a precharge voltage level during a read operation of reading information from a selected memory cell (or memory cells) of memory cell groups $1105_0$.

Precharge circuit $1130_m$ can include circuit elements (e.g., transistors P4, P5, and P6) and operate in ways similar to precharge circuit 930 of FIG. 9. For example, precharge circuit $1130_m$ can charge (e.g., precharge) conductive lines $1122_m$-$1123_m$ to a precharge voltage level during a read operation of reading information from a selected memory cell (or memory cells) of memory cell groups $1105_m$.

Memory device 1100 can include gating circuits $1126_0$ through $1126_m$. Gating circuits $1126_0$ through $1126_m$ can operate, such that conductive line 925 can be either selectively coupled to conductive lines $1122_m$-$1123_m$ (e.g., during reading of a memory cell of memory cell groups $1105_0$) or selectively coupled to conductive lines $1122_m$-$1123_m$ (e.g., during reading of a memory cell of memory cell groups $1105_m$).

Gating circuit $1126_0$ can include circuit elements (e.g., transistors $N_0$ and $N_1$) and operate in ways similar to gating circuit 926 of FIG. 9. For example, gating circuit $1126_0$ can use signals $CS_0$ and $CS_1$ to selectively couple conductive lines $1122_0$-$1123_0$ to conductive line 925 during reading of information from a selected memory cell of memory cell groups $1105_0$.

Gating circuit $1126_m$ can include circuit elements (e.g., transistors $N_0$ and $N_1$) and operate in ways similar to gating circuit 926 of FIG. 9. For example, gating circuit $1126_m$ can use signals $CS_2$ and $CS_3$ to selectively couple conductive lines $1122_m$-$1123_m$ to conductive line 925 during reading of information from a selected memory cell of memory cell groups $1105_m$.

Signal $CS_0$, $CS_1$, $CS_2$, and $CS_3$ can be activated one at a time. For example, when signal $CS_0$ is activated, signals $CS_1$, $CS_2$, and $CS_3$ are deactivated. When signal $CS_1$ is activated, signals $CS_0$, $CS_2$, and $CS_3$ are deactivated. When signal S2 is activated, signals $CS_0$, $CS_1$, and $CS_3$ are deactivated. When signal $CS_3$ is activated, signals $CS_0$, $CS_1$, and $CS_2$ are deactivated.

During a read operation of memory device 1100, the value (e.g., "0" or "1") of bit RDBL on conductive line 925 can represent the value of a bit (of the stored two bits) read from a selected memory cell in one of memory cell groups $1105_0$ through $1105_m$. For example, the value of bit RDBL represents the value of a bit (of the stored two bits) read from a selected memory cell in memory cell group $1105_0$ when signal $CS_0$ or $CS_1$ activated. The value of bit RDBL represents the value of a bit (of the stored two bits) read from a selected memory cell in memory cell group $1105_m$ when signal $CS_2$ or $CS_3$ activated.

Evaluation circuit 980, gate G1, and memory portion (e.g., circuitry) 990 can operate, such that information OUT can represent the value information stored in selected memory cells of memory cell groups $1105_0$ through $1105_m$. For example, the value of information OUT can represent the value of a bit read from a selected memory cell in memory cell group $1105_0$ when signal $CS_0$ or $CS_1$ activated. The value of information OUT can represent the value of a bit read from a selected memory cell in memory cell group $1105_m$ when signal $CS_2$ or $CS_3$ activated.

Thus, information OUT can represent the value of two bits (e.g., BL0 and BL1) read from a selected memory cell in memory cell group $1105_0$ if signals $CS_0$ and $CS_1$ are activated one after another while signals $CS_2$ and $CS_3$ are deactivated. Information OUT can represent the value of two bits (e.g., BL0 and BL1) read from a selected memory cell in memory cell group $1105_m$ if signals $CS_2$ and $CS_3$ are activated one after another while signals $CS_0$ and $CS_1$ are deactivated.

Memory device 1100 can include additional circuitry (not shown) to receive information OUT. Such circuitry can include sense amplifiers and output circuits that can further process information OUT to generate information (e.g., output data) similar to information $D_{OUT}$ through $D_{OUTN}$ of memory device 100 of FIG. 1.

FIG. 12 shows an apparatus in the form of a system (e.g., electronic system) 1200, according to some embodiments described herein. System 1200 can include or be included in a computer (e.g., desktop or notebook computer), a tablet, a cellular telephone, and other electronic devices or systems. As shown in FIG. 12, system 1200 can include a processor 1210, a memory 1220, a memory controller 1230, a graphics controller 1240, an input and output (I/O) controller 1250, a display 1252, a keyboard 1254, a pointing device 1256, at least one antenna 1258, a connector 615, and a bus 1260.

Processor 1210 can include a general-purpose processor or an application specific integrated circuit (ASIC). Memory 1220 can include a DRAM device, an SRAM device, a flash memory device, a phase change memory, or a combination of these memory devices. Memory 1220 may include other types of memory. Display 1252 can include a liquid crystal display (LCD), a touchscreen (e.g., capacitive or resistive touchscreen), or another type of display. Pointing device 1256 can include a mouse, a stylus, or another type of pointing device.

I/O controller 1250 can include a communication module for wired or wireless communication (e.g., communication through one or more antenna 1258). Such wireless communication may include communication in accordance with WiFi communication technique, Long Term Evolution Advanced (LTE-A) communication technique, or other communication techniques.

I/O controller 1250 can also include a module to allow system 1200 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1215 can be arranged (e.g., can include terminals, such as pins) to allow system 1200 to be coupled to an external device (or system). This may allow system 1200 to communicate (e.g., exchange information) with such a device (or system) through connector 1215.

Connector 1215 and at least a portion of bus 1260 can include conductive lines that conform with at least one of USB, DP, HDMI, Thunderbolt, PCIe, Ethernet, and other specifications.

FIG. 12 shows the components of system 1200 arranged separately from each other as an example. In some arrangements, two or more components of system 1200 can be located on the same die (e.g., same chip) that forms a system-on-chip (SoC).

As shown in FIG. 12, system 1200 can include ROM devices 1201a, 1210b, 1201c, 1201d, and 1201e located in (e.g., embedded in) processor 1210, a memory 1220, a memory controller 1230, a graphics controller 1240, an input and output (I/O) controller 1250, respectively. A ROM device 1201 can be used to store information (e.g., unchangeable information), such as codes (e.g., microcodes), instructions, words library, lookup table, or other information. Each of ROM devices 1201a, 1210b, 1201c, 1201d, and 1201e can include any of memory device 100, 200, 400, 600, 700, 900, and 1100 and operations (e.g., read operations) described above with reference to FIG. 1 through FIG. 11.

As shown in FIG. 12, processor 1210 can include a die (e.g., semiconductor die) 1212 and a processing core 1214 in which a ROM device 1201 can be included (e.g., embedded in the same die 1212 with processing core 1214).

Processor 1210 can include a central processing unit (CPU) where processing core 1214 and ROM device 1201*a* can be part of the CPU.

FIG. 12 shows an example of system 1200 where each of processor 1210, memory 1220, memory controller 1230, graphics controller 1240, and input and output (I/O) controller 1250 includes a ROM device (e.g., one of ROM devices 1201*a*, 1210*b*, 1201*c*, 1201*d*, and 1201*e*). In an alternative arrangement of system 1200, one or more of processor 1210, memory 1220, memory controller 1230, graphics controller 1240, and input and output (I/O) controller 1250 may not include a ROM device shown in FIG. 12. Thus, in such an alternative arrangement, one or more of ROM devices 1201*a*, 1210*b*, 1201*c*, 1201*d*, and 1201*e* may be omitted from system 1200.

The embodiments described may be implemented in one or a combination of hardware, firmware and software. Embodiments may also be implemented as instructions stored on a computer-readable storage medium, which may be read and executed by at least one processor to perform the operations and activities described herein. A computer-readable storage medium may include any non-transitory mechanism for storing information (e.g., instructions) in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors (e.g., processor 1210) may be configured with the instructions to perform the operations and activities described herein.

The illustrations of apparatus (e.g., memory devices 100, 200, 400, 600, 700, 900, and 1100 and system 1200) and methods (e.g., the operations of memory devices 100, 200, 400, 600, 700, 900, and 1100 and system 1200) described above with reference to FIG. 1 through FIG. 10) are intended to provide a general understanding of the structure of various embodiments and are not intended to provide a complete description of all the elements and features of apparatuses that might make use of the structures described herein.

The apparatus (e.g., memory devices 100, 200, 400, 600, 700, 900, and 1100 and system 1200) and methods (e.g., the operations of memory devices 100, 200, 400, 600, and 700, and system 1200) described herein may include or be included in electronic circuitry, such as high-speed computers, communication and signal processing circuitry, single or multi-processor modules, single or multiple embedded processors, multi-core processors, message information switches, and application-specific modules including multi-layer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including non-volatile memory cells, each of the non-volatile memory cells to store more than one bit of information, data lines, at most one of the data lines electrically coupled to each of the non-volatile memory cells, a circuit including transistors coupled to the data lines, the transistors including gates coupled to each other, and an encoder including input nodes and output nodes, the input nodes to receive input information from the data lines through the transistors, and the output nodes to provide output information having a value based on a value of the input information.

In Example 2, the subject matter of Example 1 may optionally include, wherein the non-volatile memory cells include first, second, and third non-volatile memory cells, the data lines include first, second, and third data lines, at most one of the first, second, and third data lines electrically coupled to each of the non-volatile memory cell, the transistors include first, second, and third transistors include gates coupled to each other, the first, second, and third transistors coupled to the first, second, and third data lines, respectively, and the input nodes of the encoder include first, second, and third input nodes coupled to the first, second, and third transistors, respectively.

In Example 3, the subject matter of Example 2 may optionally include, wherein the encoder is to perform a first logic operation on a first input bit on the first data line and a second input bit the second data line to provide a first bit of the output information, and perform a second logic operation on the second input bit and a third input on the third data lines to provide a second bit of the output information.

In Example 4, the subject matter of Example 1 may optionally include, wherein the non-volatile memory cells include a first non-volatile memory cell and a second non-volatile memory cell, the data lines include first, second, third, and fourth data lines, at most one of the first and second data lines electrically coupled to the first non-volatile memory cell, at most one of the third and fourth data lines electrically coupled to the second non-volatile memory cell, the transistors include first, second, third, and fourth transistors include gates coupled to each other, the first, second, third, and fourth transistors coupled to the first, second, third, and fourth data lines, respectively, and the input nodes of the encoder include first, second, and third input nodes coupled to the first, second, and third transistors, respectively.

In Example 5, the subject matter of Example 4 may optionally include, wherein the encoder is to perform a first logic operation on a first input bit on the first date line and a second input bit on the second data line to provide a first bit of the output information, perform a second logic operation on a third input bit on the third data line and a fourth input bit on the fourth data line to provide a second bit of the output information, and perform a third logic operation on the first and fourth input bits to provide a third bit of the output information.

In Example 6, the subject matter of Example 1 may optionally include, wherein the input information includes a first input bit on a first data line of the first data line, a second input bit on a second data line of the data lines, an a third input bit on a third data line of the data lines.

In Example 7, the subject matter of Example 6 may optionally include, wherein the output information includes a first output bit on a first output node of the output nodes, and a second output bit on a second output node of the output nodes.

In Example 8, the subject matter of Example 7 may optionally include, wherein the encoder includes a first logic gate including a first input node to receive the first input bit, a second input node to receive the second input bit, and an output node to provide the first output bit, and a second logic gate including a first input node to receive the second input bit, a second input node to receive the third input bit, and an output node to provide the second output bit.

In Example 9, the subject matter of Example 8 may optionally include, wherein each of the first and second logic gates include a NAND gate.

In Example 10, the subject matter of Example 1 may optionally include, wherein the input information includes a first input bit on a first data line of the first data line, a second input bit on a second data line of the data lines, a third input bit on a third data line of the data lines, and a fourth input bit on a fourth data line of the data lines.

In Example 11, the subject matter of Example 10 may optionally include, wherein the output input information includes a first output bit on a first output node of the output nodes, a second output bit on a second output node of the output nodes, and a third output bit on a third output node of the output nodes.

In Example 12, the subject matter of Example 11 may optionally include, wherein the encoder includes a first logic gate including a first input node to receive the first input bit, a second input node to receive the second input bit, and an output node to provide the first output bit, a second logic gate including a first input node to receive the third input bit, a second input node to receive the fourth input bit, and an output node to provide the second output bit, and a third second logic gate including a first input node to receive the first input bit, a second input node to receive the fourth input bit, and an output node to provide the third output bit.

In Example 13, the subject matter of Example 12 may optionally include, wherein each of the first and third logic gates include a NAND gate, and the second logic gate includes an exclusive-OR gate.

In Example 14, the subject matter of Example 1 may optionally include, wherein the output nodes include a first output node and a second output node, the value of the output information includes a value of a first output bit on the first output node and a value of a second output bit on the second output node, and wherein the value of the first output bit is based on the values of the first and second input bits, and the value of the second output bit is based on the values of the second and third input bits In Example 15, the subject matter of Example 1 may optionally include, further comprising additional data lines, wherein the circuit includes additional transistors coupled to the additional data lines, the additional transistors including gates coupled to each other, and the gates of the additional transistors are electrically separated from the gates of the transistors, and the input nodes of the encoder to receive additional input information from the additional data lines through the additional transistors, and the output nodes to provide additional output information having a value based on a value of the additional input information Example 16 includes subject matter (such as a device, an electronic apparatus (e.g., circuit, electronic system, or both), or a machine) including a non-volatile memory cell including a transistor located in a location of a non-volatile memory device, the location being defined by a cell boundary, and conductive regions electrically separated from each other, each of the conductive regions being part of a separate data line among data lines of the non-volatile memory device, the data lines including conductive lines spanning over the cell boundary.

In Example 17, the subject matter of Example 16 may optionally include, wherein the conductive lines form no electrical connection with the transistor.

In Example 18, the subject matter of Example 16 may optionally in at most one of the conductive lines form an electrical connection with the non-volatile memory cell.

In Example 19, the subject matter of Example 16 may optionally include, wherein the conductive regions include a first conductive region of a first conductive line among the conductive lines, a second conductive region of a second conductive line among the conductive lines, and a third conductive region of a third conductive line among the conductive lines.

In Example 20, the subject matter of Example 16 may optionally include, wherein the non-volatile memory cell is a first non-volatile memory cell, the non-volatile memory device includes a second non-volatile memory cell located next to the first non-volatile memory cell, and the conductive lines span over a cell boundary of the second non-volatile memory cell.

In Example 21, the subject matter of Example 16 may optionally include, wherein the transistor includes Fin Field-effect transistor (FinFET) structure.

Example 22 includes subject matter (such as a device, an electronic apparatus (e.g., circuit, electronic system, or both), or a machine) including non-volatile memory cells, each of the non-volatile memory cells to store more than one bit of information, conductive lines, each of the conductive lines coupled to at least one of a source and a drain of a transistor of at least one of the non-volatile memory cells, a circuit to selectively couple the conductive lines to a data line during reading of a first bit of information from a selected non-volatile memory cell among the non-volatile memory cells and during reading of a second bit of information from the selected non-volatile memory cell.

In Example 23, the subject matter of Example 22 may optionally include, wherein the circuit is to couple a first combination of the conductive lines to the data line during reading of the first bit of information from the selected non-volatile memory cell, and the circuit is to couple a second combination of the conductive lines to the data line during reading of the second bit of information from the selected non-volatile memory cell.

In Example 24, the subject matter of Example 23 may optionally include, wherein the conductive lines include first, second, and third conductive lines, and wherein the first combination of the conductive lines includes the first and third conductive lines, and the second combination of the conductive lines includes the second and third conductive lines.

In Example 25, the subject matter of Example 22 may optionally include, wherein the circuit includes first transistors having gates to receive a first signal during reading of the first bit of information from the selected non-volatile memory cell, and second transistors having gates to receive a second signal during reading of the second bit of information from the selected non-volatile memory cell.

Example 26 includes subject matter (such as a device, an electronic apparatus (e.g., circuit, electronic system, or both), or a machine) including a processing core included in a die, and a read-only-memory (ROM) device included in the die and coupled to the processing core, the ROM including non-volatile memory cells, each of the non-volatile memory cells to store more than one bit of information, data lines, at most one of the data lines electrically coupled to each of the non-volatile memory cells, a circuit including transistors coupled to the data lines, the transistors including gates coupled to each other, and an encoder including input nodes and output nodes, the input nodes to receive input information from the data lines through the transistors, and the output nodes to provide output information having a value based on a value of the input information.

In Example 27, the subject matter of Example 26 may optionally include, wherein the processing core is part of a central processing unit (CPU).

In Example 28, the subject matter of Example 26 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

In Example 29, the subject matter of Example 26 may optionally include, further comprising an antenna coupled to the die.

The subject matter of Example 1 through Example 29 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   non-volatile memory cells, each of the non-volatile memory cells to store more than one bit of information;
   data lines, at most one of the data lines electrically coupled to each of the non-volatile memory cells;
   a circuit including transistors coupled to the data lines, the transistors including gates coupled to each other; and
   an encoder including:
   a first logic gate including a first input node to receive a first input bit on a first data line of the first data line, a second input node to receive a second input bit on a second data line of the data lines, and an output node to provide a first output bit; and
   a second logic gate including a first input node to receive the second input bit a second input node to receive a third input bit on a third data line of the data lines, and an output node to provide a second output bit.

2. The apparatus of claim 1, wherein each of the first and second logic gates include a NAND gate.

3. The apparatus of claim 1, further comprising additional data lines, wherein:
   the circuit includes additional transistors coupled to the additional data lines, the additional transistors including gates coupled to each other, and the gates of the additional transistors are electrically separated from the gates of the transistors; and
   the encoder is to receive additional input information from the additional data lines through the additional transistors, and to provide additional output information having a value based on a value of the additional input information.

4. An apparatus comprising:
   non-volatile memory cells, each of the non-volatile memory cells to store more than one bit of information,
   data lines, at most one of the data lines electrically coupled to each of the non-volatile memory cells;
   a circuit including transistors coupled to the data lines, the transistors including gates coupled to each other;
   an encoder including input nodes and output nodes, the input nodes to receive input information from the data lines through the transistors, and the output nodes to provide output information having a value based on a value of the input information, wherein,
   the non-volatile memory cells include first, second, and third non-volatile memory cells;
   the data lines include first, second, and third data lines, at most one of the first, second, and third data lines electrically coupled to each of the non-volatile memo cell;
   the transistors include first, second, and third transistors include gates coupled to each other, the first, second, and third transistors coupled to the first, second, and third data lines, respectively; and
   the input nodes of the encoder include first, second, and third input nodes coupled to the first, second, and third transistors, respectively and wherein the encoder is to:
   perform a first logic operation on a first input bit on the first data line and a second input bit the second data line to provide a first bit of the output information; and
   perform a second logic operation on the second input bit and a third input on the third data lines to provide a second bit of the output information.

5. An apparatus comprising:
   non-volatile memory cells, each of the non-volatile memory cells to store more than one bit of information;

data lines, at most one of the data lines electrically coupled to each of the non-volatile memory cells;

a circuit including transistors coupled to the data lines, the transistors including gates coupled to each other;

an encoder including input nodes and output nodes, the input nodes to receive input information from the data lines through the transistors, and the output nodes to provide output information having a value based on a value of the input information, wherein, the non-volatile memory cells include a first non-volatile memory cell and a second non-volatile memory cell;

the data lines include first, second, third, and fourth data lines, at most one of the first and second data lines electrically coupled to the first non-volatile memory cell, at most one of the third and fourth data lines electrically coupled to the second non-volatile memory cell;

the transistors include first, second, third and fourth transistors include gates coupled to each other, the first, second, third, and fourth transistors coupled to the first, second, third, and fourth data lines, respectively; and the input nodes of the encoder include first, second, and third input nodes coupled to the first, second, and third transistors, respectively, and wherein the encoder is to:

perform a first logic operation on a first input bit on the first date line and a second input bit on the second data line to provide a first bit of the output information;

perform a second logic operation on a third input bit on the third data line and a fourth input bit on the fourth data line to provide a second bit of the output information; and perform a third logic operation on the first and fourth input bits to provide a third bit of the output information.

6. An apparatus comprising:

non-volatile memory cells, each of the non-volatile memory cells to store more than one bit of information;

data lines, at most one of the data lines electrically coupled to each of the non-volatile memory cells;

a circuit including transistors coupled to the data lines, the transistors including gates coupled to each other;

an encoder including input nodes and output nodes, the input nodes to receive input information from the data lines through the transistors, and the output nodes to provide output information having a value based on a value of the input information, wherein the output input information includes a first output bit on a first output node of the output nodes, a second output bit on a second output node of the output nodes, and a third output bit on a third output node of the output nodes, wherein the input information includes a first input bit on a first data line of the first data line, a second input bit on a second data line of the data lines, a third input bit on a third data line of the data lines and a fourth input bit on a fourth data line of the data lines, and, wherein the encoder includes:

a first logic gate including a first input node to receive the first input bit, a second input node to receive the second input bit, and an output node to provide the first output bit;

a second logic gate including a first input node to receive the third input bit, second input node to receive the fourth input bit, and an output node to provide the second output bit; and a third logic gate including a first input node to receive the first input bit, a second input node to receive the fourth input bit, and an output node to provide the third output bit.

7. An apparatus comprising:

a processing core included in a die; and a read-only-memory (ROM) device included in the die and coupled to the processing core, the ROM including:

non-volatile memory cells, each of the non-volatile memory cells to store more than one bit of information;

first data lines coupled to a first group of the non-volatile memory cells;

second data lines coupled to a second group of the non-volatile memory cells;

a circuit including first transistors coupled to the first data lines, the first transistors including first gates coupled to each other, and second transistors coupled to the second data lines, the second transistors including second gates coupled to each other;

a word line coupled to a memory cell in the first group of the non-volatile memory cells and to a memory cell in the second group of the non-volatile memory cells; and an encoder including:

a first logic gate including a first input node to receive a first input bit on a first data line of the first data line, a second input node to receive a second input bit on a second data line of the data lines, and an output node to provide a first output bit; and a second logic gate including a first input node to receive the second input bit, a second input node to receive a third input bit on a third data line of the data lines, and an output node to provide a second output bit.

8. The apparatus of claim 7, further comprising a connector coupled to the processor, the connector conforming with one of Universal Serial Bus (USB), High-Definition Multimedia interface (HDMI), Thunderbolt, Peripheral Component Interconnect Express (PCIe), and Ethernet specifications.

* * * * *

UNITED STATES PATENT AND TRADEMARK OFFICE
CERTIFICATE OF CORRECTION

PATENT NO. : 11,152,060 B2
APPLICATION NO. : 16/449285
DATED : October 19, 2021
INVENTOR(S) : Wang et al.

Page 1 of 1

It is certified that error appears in the above-identified patent and that said Letters Patent is hereby corrected as shown below:

In the Claims

In Column 34, Line 16, in Claim 1, after "bit", insert --,--

In Column 34, Line 36, in Claim 4, delete "information," and insert --information;-- therefor In Column 34, Line 50, in Claim 4, delete "memo" and insert --memory-- therefor In Column 34, Line 58, in Claim 4, after "respectively", insert --,--

In Column 35, Line 18, in Claim 5, after "third", insert --,--

In Column 36, Line 2, in Claim 6, after "lines", insert --,--

In Column 36, Line 10, in Claim 6, after "bit,", insert --a--

In Column 36, Line 49, in Claim 8, delete "interface" and insert --Interface-- therefor Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*